(12) United States Patent
Horn et al.

(10) Patent No.: US 11,949,426 B2
(45) Date of Patent: Apr. 2, 2024

(54) CONFIGURABLE ANALOG-TO-DIGITAL CONVERSION PARAMETERS

(71) Applicant: QUALCOMM Incorporated, San Diego, CA (US)

(72) Inventors: Idan Michael Horn, Hod Hasharon (IL); Shay Landis, Hod Hasharon (IL); Assaf Touboul, Netanya (IL); Amit Bar-Or Tillinger, Tel-Aviv (IL)

(73) Assignee: QUALCOMM Incorporated, San Diego, CA (US)

( * ) Notice: Subject to any disclaimer, the term of this patent is extended or adjusted under 35 U.S.C. 154(b) by 127 days.

(21) Appl. No.: 17/124,196

(22) Filed: Dec. 16, 2020

(65) Prior Publication Data

US 2022/0190838 A1 Jun. 16, 2022

(51) Int. Cl.
| | |
|---|---|
| *H03M 1/20* | (2006.01) |
| *H03M 1/12* | (2006.01) |
| *H04B 17/336* | (2015.01) |
| *H04W 72/1268* | (2023.01) |
| *H04W 72/51* | (2023.01) |
| *H04W 72/541* | (2023.01) |

(52) U.S. Cl.
CPC ........... *H03M 1/20* (2013.01); *H03M 1/1245* (2013.01); *H04B 17/336* (2015.01); *H04W 72/1268* (2013.01); *H04W 72/51* (2023.01); *H04W 72/541* (2023.01)

(58) Field of Classification Search
None
See application file for complete search history.

(56) References Cited

U.S. PATENT DOCUMENTS

| | | | | |
|---|---|---|---|---|
| 6,127,955 A | * | 10/2000 | Handel | ............... H03M 1/1038 341/120 |
| 6,268,814 B1 | * | 7/2001 | Kolsrud | .................. H03M 1/20 |

(Continued)

FOREIGN PATENT DOCUMENTS

WO   2019050536 A1   3/2019

OTHER PUBLICATIONS

International Search Report and Written Opinion—PCT/US2021/058476—ISA/EPO—dated Mar. 21, 2022.

*Primary Examiner* — Charles C Jiang
*Assistant Examiner* — Shawn D Miller
(74) *Attorney, Agent, or Firm* — Loza & Loza, LLP

(57) ABSTRACT

Aspects relate to analog-to-digital conversion of an analog signal. The resolution (number of bits) and/or the quantization levels of the analog-to-digital conversion may be configurable. A device may configure its analog-to-digital conversion parameters. For example, a first device may reduce the number of bits for its analog-to-digital converter to reduce power consumption. In this case, the first device may transmit an indication of selected analog-to-digital conversion parameters to a second device that will transmit to the first device. In this way, the second device may take appropriate action, if needed. A device may request another device to use certain analog-to-digital conversion parameters. For example, a first device may determine that a second device should use a larger number of bits for its analog-to-digital conversion process to improve the quality of the communication between the first and second devices.

30 Claims, 16 Drawing Sheets

(56) References Cited

U.S. PATENT DOCUMENTS

| | | | | |
|---|---|---|---|---|
| 6,362,762 B1* | 3/2002 | Jensen | ............... | H03M 3/396 |
| | | | | 341/143 |
| 8,031,098 B1* | 10/2011 | Ebner | ............... | H03M 1/1061 |
| | | | | 341/146 |
| 9,184,775 B2* | 11/2015 | Reinhardt | ............... | H04B 1/12 |
| 9,419,637 B1* | 8/2016 | Pagnanelli | ............ | H03M 3/468 |
| 10,084,469 B1* | 9/2018 | Pflum | ............... | H03M 1/145 |
| 10,970,441 B1* | 4/2021 | Zhang | ............... | G06N 3/063 |
| 2001/0010500 A1* | 8/2001 | Lundin | ............ | H03M 1/1038 |
| | | | | 341/120 |
| 2008/0056408 A1* | 3/2008 | Mezer | ............... | H04L 25/03878 |
| | | | | 375/316 |
| 2011/0085493 A1* | 4/2011 | Chang | ............... | H04L 1/0038 |
| | | | | 370/328 |
| 2014/0062738 A1* | 3/2014 | Wu | ............... | H03M 1/0626 |
| | | | | 341/118 |
| 2014/0354335 A1* | 12/2014 | Syllaios | ............... | H03L 7/193 |
| | | | | 327/157 |
| 2016/0174126 A1* | 6/2016 | Bontu | ............... | H04W 36/0058 |
| | | | | 370/332 |
| 2017/0164236 A1 | 6/2017 | Boldi et al. | | |
| 2017/0223653 A1* | 8/2017 | Weitnauer | ............ | H04W 56/0045 |
| 2017/0318495 A1* | 11/2017 | Anjum | ............... | H04W 28/02 |
| 2018/0269896 A1* | 9/2018 | Ouzounov | ............ | H03M 3/322 |
| 2019/0245549 A1* | 8/2019 | Nikitin | ............... | H03H 17/0219 |
| 2020/0100140 A1* | 3/2020 | Bendlin | ............... | H04W 28/06 |
| 2020/0259543 A1 | 8/2020 | Islam et al. | | |
| 2020/0260376 A1* | 8/2020 | Islam | ............... | H04W 36/0058 |
| | | | | 370/332 |
| 2021/0091983 A1* | 3/2021 | Barrier, IV | ............ | H04L 27/0014 |
| 2021/0211981 A1* | 7/2021 | Greenberger | ..... | H04W 72/0406 |
| 2021/0314201 A1* | 10/2021 | Nikitin | ............... | H03M 5/02 |
| 2021/0375492 A1* | 12/2021 | Walker | ............... | G06N 3/08 |
| 2022/0038349 A1* | 2/2022 | Li | ............... | G06N 3/08 |

* cited by examiner

1

CONFIGURABLE ANALOG-TO-DIGITAL CONVERSION PARAMETERS

TECHNICAL FIELD

The technology discussed below relates generally to wireless communication and, more particularly, to configurable parameters for analog-to-digital conversion of an analog signal.

Introduction

Next-generation wireless communication systems (e.g., 5GS) may include a 5G core network and a 5G radio access network (RAN), such as a New Radio (NR)-RAN. The NR-RAN supports communication via one or more cells. For example, a wireless communication device such as a user equipment (UE) may access a first cell of a first base station (BS) such as a gNB and/or access a second cell of a second base station.

A device (e.g., a UE) that receives an analog transmission from another device (e.g., a BS) performs an analog-to-digital conversion on the received transmission to provide digital information for subsequent processing. The characteristics of the analog-to-digital conversion depend, in part, on the quantization levels used to sample the received transmission and the resulting number of bit generated by the sampling of the received transmission.

BRIEF SUMMARY OF SOME EXAMPLES

The following presents a summary of one or more aspects of the present disclosure, in order to provide a basic understanding of such aspects. This summary is not an extensive overview of all contemplated features of the disclosure and is intended neither to identify key or critical elements of all aspects of the disclosure nor to delineate the scope of any or all aspects of the disclosure. Its sole purpose is to present some concepts of one or more aspects of the disclosure in a form as a prelude to the more detailed description that is presented later.

Various aspects of the disclosure relate to analog-to-digital conversion of an analog signal. In some aspects, one or more parameters of the analog-to-digital conversion are configurable. For example, the resolution (number of bits) of the analog-to-digital conversion may be configurable. As another example, the quantization levels of the analog-to-digital conversion may be configurable.

In some examples, a device (e.g., a UE) may configure its analog-to-digital conversion parameters. For example, a UE may reduce the number of bits for its analog-to-digital converter to reduce the power consumption of the UE. In this case, the UE may transmit an indication of the selected analog-to-digital conversion parameters to another device (e.g., a BS) that will transmit to the UE. In this way, the UE may enable the other device to take appropriate action, if needed. For example, upon receiving an indication that a UE will use fewer bits, a BS may take action to compensate for the reduced number of bits.

In some examples, a device (e.g., a BS) may request another device (e.g., a UE) to used certain analog-to-digital conversion parameters. For example, a BS may determine that a UE should use a larger number of bits for an analog-to-digital converter of the UE to improve the quality of the communication between the BS and the UE.

In some aspects, these techniques may be used to optimize the number of analog-to-digital converter bits to the desired throughput. In some aspects, these techniques may be used to minimize the power per analog-to-digital converter bit at the UE.

In some examples, a method for wireless communication at a user equipment may include determining a first number of bits to use for an analog-to-digital conversion of a transmission from a base station, transmitting a first indication of the first number of bits to the base station, receiving the transmission from the base station, and performing the analog-to-digital conversion of the transmission.

In some examples, a user equipment may include a transceiver, a memory, and a processor communicatively coupled to the transceiver and the memory. The processor and the memory may be configured to determine a first number of bits to use for an analog-to-digital conversion of a transmission from a base station, transmit a first indication of the first number of bits to the base station via the transceiver, receive the transmission from the base station via the transceiver, and perform the analog-to-digital conversion of the transmission.

In some examples, a user equipment may include means for determining a first number of bits to use for an analog-to-digital conversion of a transmission from a base station, means for transmitting a first indication of the first number of bits to the base station, means for receiving the transmission from the base station, and means for performing the analog-to-digital conversion of the transmission.

In some examples, an article of manufacture for use by a user equipment includes a computer-readable medium having stored therein instructions executable by one or more processors of the user equipment to determine a first number of bits to use for an analog-to-digital conversion of a transmission from a base station, transmit a first indication of the first number of bits to the base station, receive the transmission from the base station, and perform the analog-to-digital conversion of the transmission.

One or more of the following features may be applicable to one or more of the method, the apparatuses, and the computer-readable medium of the preceding paragraphs. The first indication may specify an effective number of bits for the analog-to-digital conversion. Determining the first number of bits may include measuring a reference signal received power (RSRP) or a signal-to-noise-plus interference ratio (SINR) of a signal received from the base station, and selecting the first number of bits based on the RSRP or the SINR. Determining the first number of bits may include measuring interference at the user equipment and selecting the first number of bits based on the interference. Determining the first number of bits may include determining remaining battery power at the user equipment and selecting the first number of bits based on the remaining battery power. Determining the first number of bits may include receiving a second indication of a modulation and coding scheme and determining the first number of bits based on the second indication of the modulation and coding scheme.

In some examples, a method for wireless communication at a base station may include determining a first number of bits for a user equipment to use for an analog-to-digital conversion of a transmission from the base station, transmitting a first indication of the first number of bits to the user equipment, and transmitting the transmission to the user equipment.

In some examples, a base station may include a transceiver, a memory, and a processor communicatively coupled to the transceiver and the memory. The processor and the memory may be configured to determine a first number of bits for a user equipment to use for an analog-to-digital conversion of a transmission from the base station, transmit a first indication of the first number of bits to the user equipment via the transceiver, and transmit the transmission to the user equipment via the transceiver.

In some examples, a base station may include means for determining a first number of bits for a user equipment to use for an analog-to-digital conversion of a transmission from the base station, means for transmitting a first indication of the first number of bits to the user equipment, and means for transmitting the transmission to the user equipment.

In some examples, an article of manufacture for use by a base station includes a computer-readable medium having stored therein instructions executable by one or more processors of the base station to determine a first number of bits for a user equipment to use for an analog-to-digital conversion of a transmission from the base station, transmit a first indication of the first number of bits to the user equipment, and transmit the transmission to the user equipment.

One or more of the following features may be applicable to one or more of the method, the apparatuses, and the computer-readable medium of the preceding paragraphs. The first indication may specify an effective number of bits for the analog-to-digital conversion. The first indication may specify an initial number of bits for the analog-to-digital conversion. The first indication may specify a modulation and coding scheme. Determining the first number of bits may include estimating a quantity of bits needed for the user equipment to pass a cyclic redundancy check on the transmission. Determining the first number of bits may include estimating interference associated with the user equipment and selecting the first number of bits based on the interference.

These and other aspects of the disclosure will become more fully understood upon a review of the detailed description, which follows. Other aspects, features, and embodiments of the present disclosure will become apparent to those of ordinary skill in the art, upon reviewing the following description of specific, example embodiments of the present disclosure in conjunction with the accompanying figures. While features of the present disclosure may be discussed relative to certain embodiments and figures below, all embodiments of the present disclosure can include one or more of the advantageous features discussed herein. In other words, while one or more embodiments may be discussed as having certain advantageous features, one or more of such features may also be used in accordance with the various embodiments of the disclosure discussed herein. In similar fashion, while example embodiments may be discussed below as device, system, or method embodiments it should be understood that such example embodiments can be implemented in various devices, systems, and methods.

DETAILED DESCRIPTION

Figure 1:
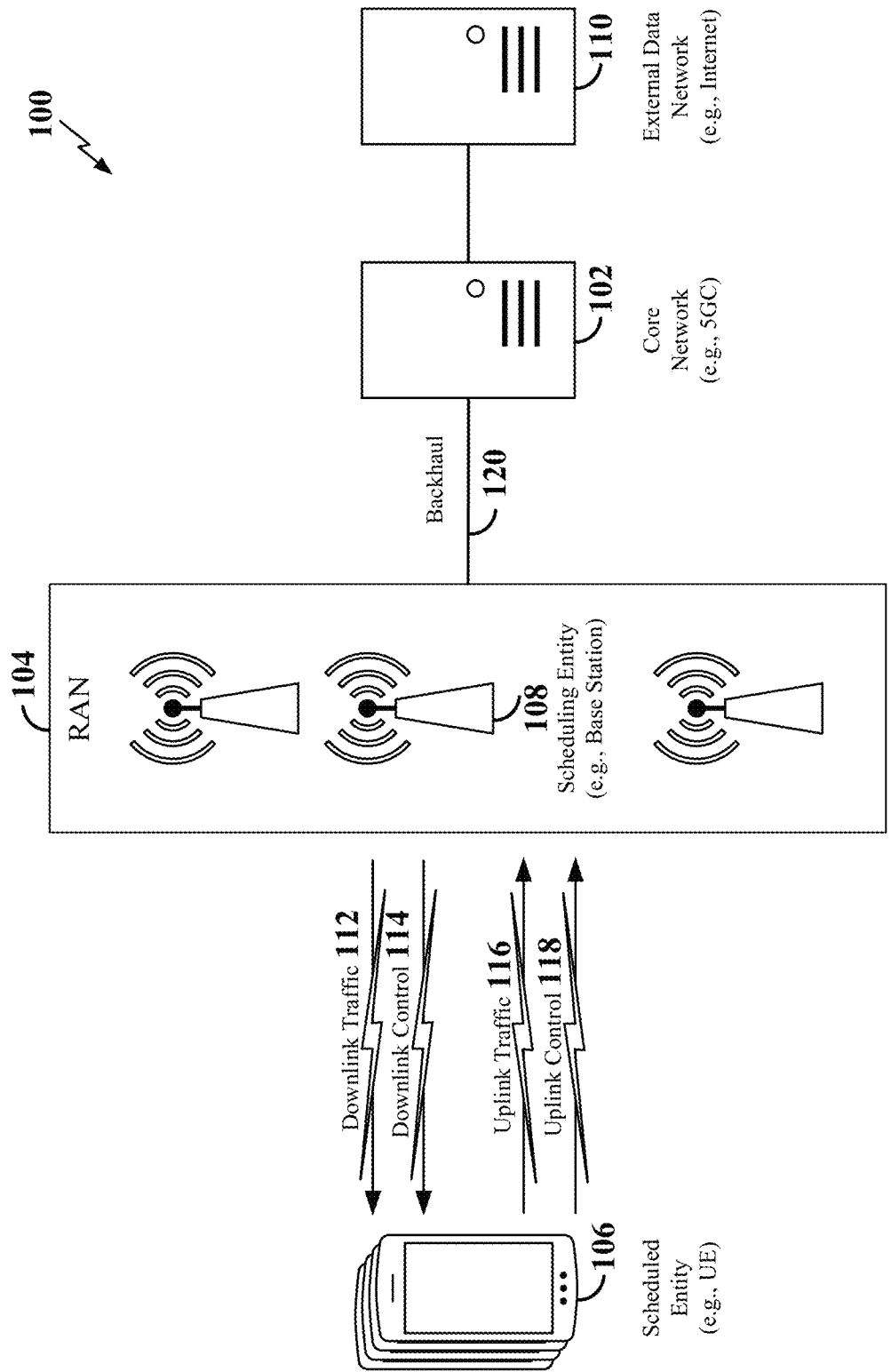
FIG. 1 is a schematic illustration of a wireless communication system according to some aspects.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form to avoid obscuring such concepts.

While aspects and embodiments are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, embodiments and/or uses may come about via integrated chip embodiments and other non-module-component based devices (e.g., end-user devices, vehicles, communication devices, computing devices, industrial equipment, retail/purchasing devices, medical devices, artificial intelligence-enabled devices, etc.). While some examples may or may not be specifically directed to use cases or applications, a wide assortment of applicability of described innovations may occur. Implementations may range a spectrum from chip-level or modular components to non-modular, nonchip-level implementations and further to aggregate, distributed, or OEM devices or systems incorporating one or more aspects of the described innovations. In some practical settings, devices incorporating described aspects and features may also necessarily include additional components and features for implementation and practice of claimed and described embodiments. For example, transmission and reception of wireless signals necessarily includes a number of components for analog and digital purposes (e.g., hardware components including antenna, RF-chains, power amplifiers, modulators, buffer, processor(s), interleaver, adders/summers, etc.). It is intended that innovations described herein may be practiced in a wide variety of devices, chip-level components, systems, distributed arrangements, end-user devices, etc. of varying sizes, shapes and constitution.

The disclosure relates in some aspects to analog-to-digital conversion of an analog signal. The resolution (number of bits) and/or the quantization levels of the analog-to-digital conversion may be configurable. In some examples, a UE may configure its own analog-to-digital conversion parameters. For example, the UE may reduce the number of bits used by its analog-to-digital converter to reduce power consumption. In this case, the UE may transmit an indication of the selected analog-to-digital conversion parameters to a base station that will transmit to the UE. In this way, the base station may take appropriate action, if needed. A base station may request that a UE use certain analog-to-digital conversion parameters. For example, the base station may determine that the UE should use a larger number of bits for its analog-to-digital conversion process to improve the quality of the communication between the base station and the UE.

The various concepts presented throughout this disclosure may be implemented across a broad variety of telecommunication systems, network architectures, and communication standards. Referring now to FIG. 1, as an illustrative example without limitation, various aspects of the present disclosure are illustrated with reference to a wireless communication system 100. The wireless communication system 100 includes three interacting domains: a core network 102, a radio access network (RAN) 104, and at least one scheduled entity 106. The at least one scheduled entity 106 may be referred to as a user equipment (UE) 106 in the discussion that follows. The RAN 104 includes at least one scheduling entity 108. The at least one scheduling entity 108 may be referred to as a base station (BS) 108 in the discussion that follows. By virtue of the wireless communication system 100, the UE 106 may be enabled to carry out data communication with an external data network 110, such as (but not limited to) the Internet.

The RAN 104 may implement any suitable wireless communication technology or technologies to provide radio access to the UE 106. As one example, the RAN 104 may operate according to $3^{rd}$ Generation Partnership Project (3GPP) New Radio (NR) specifications, often referred to as 5G. As another example, the RAN 104 may operate under a hybrid of 5G NR and Evolved Universal Terrestrial Radio Access Network (eUTRAN) standards, often referred to as LTE. The 3GPP refers to this hybrid RAN as a next-generation RAN, or NG-RAN. Of course, many other examples may be utilized within the scope of the present disclosure.

As illustrated, the RAN 104 includes a plurality of base stations 108. Broadly, a base station is a network element in a radio access network responsible for radio transmission and reception in one or more cells to or from a UE. In different technologies, standards, or contexts, a base station may variously be referred to by those skilled in the art as a base transceiver station (BTS), a radio base station, a radio transceiver, a transceiver function, a basic service set (BSS), an extended service set (ESS), an access point (AP), a Node B (NB), an eNode B (eNB), a gNode B (gNB), a transmission and reception point (TRP), or some other suitable terminology. In some examples, a base station may include two or more TRPs that may be co-located or non-co-located. The TRPs may communicate on the same carrier frequency or different carrier frequencies within the same frequency band or different frequency bands.

The radio access network 104 is further illustrated supporting wireless communication for multiple mobile apparatuses. A mobile apparatus may be referred to as user equipment (UE) in 3GPP standards, but may also be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology. A UE may be an apparatus that provides a user with access to network services.

Within the present document, a "mobile" apparatus need not necessarily have a capability to move, and may be stationary. The term mobile apparatus or mobile device broadly refers to a diverse array of devices and technologies. UEs may include a number of hardware structural components sized, shaped, and arranged to help in communication; such components can include antennas, antenna arrays, RF chains, amplifiers, one or more processors, etc. electrically coupled to each other. For example, some non-limiting examples of a mobile apparatus include a mobile, a cellular (cell) phone, a smart phone, a session initiation protocol (SIP) phone, a laptop, a personal computer (PC), a notebook, a netbook, a smartbook, a tablet, a personal digital assistant (PDA), and a broad array of embedded systems, e.g., corresponding to an "Internet of Things" (IoT). A mobile apparatus may additionally be an automotive or other transportation vehicle, a remote sensor or actuator, a robot or robotics device, a satellite radio, a global positioning system (GPS) device, an object tracking device, a drone, a multi-copter, a quad-copter, a remote control device, a consumer and/or wearable device, such as eyewear, a wearable camera, a virtual reality device, a smart watch, a health or fitness tracker, a digital audio player (e.g., MP3 player), a camera, a game console, etc. A mobile apparatus may additionally be a digital home or smart home device such as a home audio, video, and/or multimedia device, an appliance, a vending machine, intelligent lighting, a home security system, a smart meter, etc. A mobile apparatus may additionally be a smart energy device, a security device, a solar panel or solar array, a municipal infrastructure device controlling electric power (e.g., a smart grid), lighting, water, etc.; an industrial automation and enterprise device; a logistics controller; agricultural equipment; military defense equipment, vehicles, aircraft, ships, and weaponry, etc. Still further, a mobile apparatus may provide for connected medicine or telemedicine support, i.e., health care at a distance. Telehealth devices may include telehealth monitoring devices and telehealth administration devices, whose communication may be given preferential treatment or prioritized access over other types of information, e.g., in terms of prioritized access for transport of critical service data, and/or relevant QoS for transport of critical service data.

Wireless communication between a RAN 104 and a UE 106 may be described as utilizing an air interface. Transmissions over the air interface from a base station (e.g., base station 108) to one or more UEs (e.g., UE 106) may be referred to as downlink (DL) transmission. In some examples, the term downlink may refer to a point-to-multipoint transmission originating at a scheduling entity (described further below, e.g., base station 108). Another way to describe this point-to-multipoint transmission scheme may be to use the term broadcast channel multiplexing. Transmissions from a UE (e.g., UE 106) to a base station (e.g., base station 108) may be referred to as uplink (UL) transmissions. In some examples, the term uplink may refer to a point-to-point transmission originating at a scheduled entity (described further below, e.g., UE 106).

In some examples, access to the air interface may be scheduled, wherein a scheduling entity (e.g., a base station 108) allocates resources for communication among some or all devices and equipment within its service area or cell. Within the present disclosure, as discussed further below, the scheduling entity may be responsible for scheduling, assigning, reconfiguring, and releasing resources for one or more scheduled entities. That is, for scheduled communication, UEs 106, which may be scheduled entities, may utilize resources allocated by the scheduling entity 108.

Base stations 108 are not the only entities that may function as scheduling entities. That is, in some examples, a UE may function as a scheduling entity, scheduling resources for one or more scheduled entities (e.g., one or more other UEs).

As illustrated in FIG. 1, a scheduling entity 108 may broadcast downlink traffic 112 to one or more scheduled entities 106. Broadly, the scheduling entity 108 is a node or device responsible for scheduling traffic in a wireless communication network, including the downlink traffic 112 and, in some examples, uplink traffic 116 and/or uplink control information 118 from one or more scheduled entities 106 to the scheduling entity 108. On the other hand, the scheduled entity 106 is a node or device that receives downlink control information 114, including but not limited to scheduling information (e.g., a grant), synchronization or timing information, or other control information from another entity in the wireless communication network such as the scheduling entity 108.

In addition, the uplink and/or downlink control information and/or traffic information may be time-divided into frames, subframes, slots, and/or symbols. As used herein, a symbol may refer to a unit of time that, in an orthogonal frequency division multiplexed (OFDM) waveform, carries one resource element (RE) per sub-carrier. A slot may carry 7 or 14 OFDM symbols in some examples. A subframe may refer to a duration of 1 millisecond (ms). Multiple subframes or slots may be grouped together to form a single frame or radio frame. Of course, these definitions are not required, and any suitable scheme for organizing waveforms may be utilized, and various time divisions of the waveform may have any suitable duration.

In general, base stations 108 may include a backhaul interface for communication with a backhaul portion 120 of the wireless communication system. The backhaul 120 may provide a link between a base station 108 and the core network 102. Further, in some examples, a backhaul network may provide interconnection between the respective base stations 108. Various types of backhaul interfaces may be employed, such as a direct physical connection, a virtual network, or the like using any suitable transport network.

The core network 102 may be a part of the wireless communication system 100, and may be independent of the radio access technology used in the RAN 104. In some examples, the core network 102 may be configured according to 5G standards (e.g., 5GC). In other examples, the core network 102 may be configured according to a 4G evolved packet core (EPC), or any other suitable standard or configuration.

Figure 2:
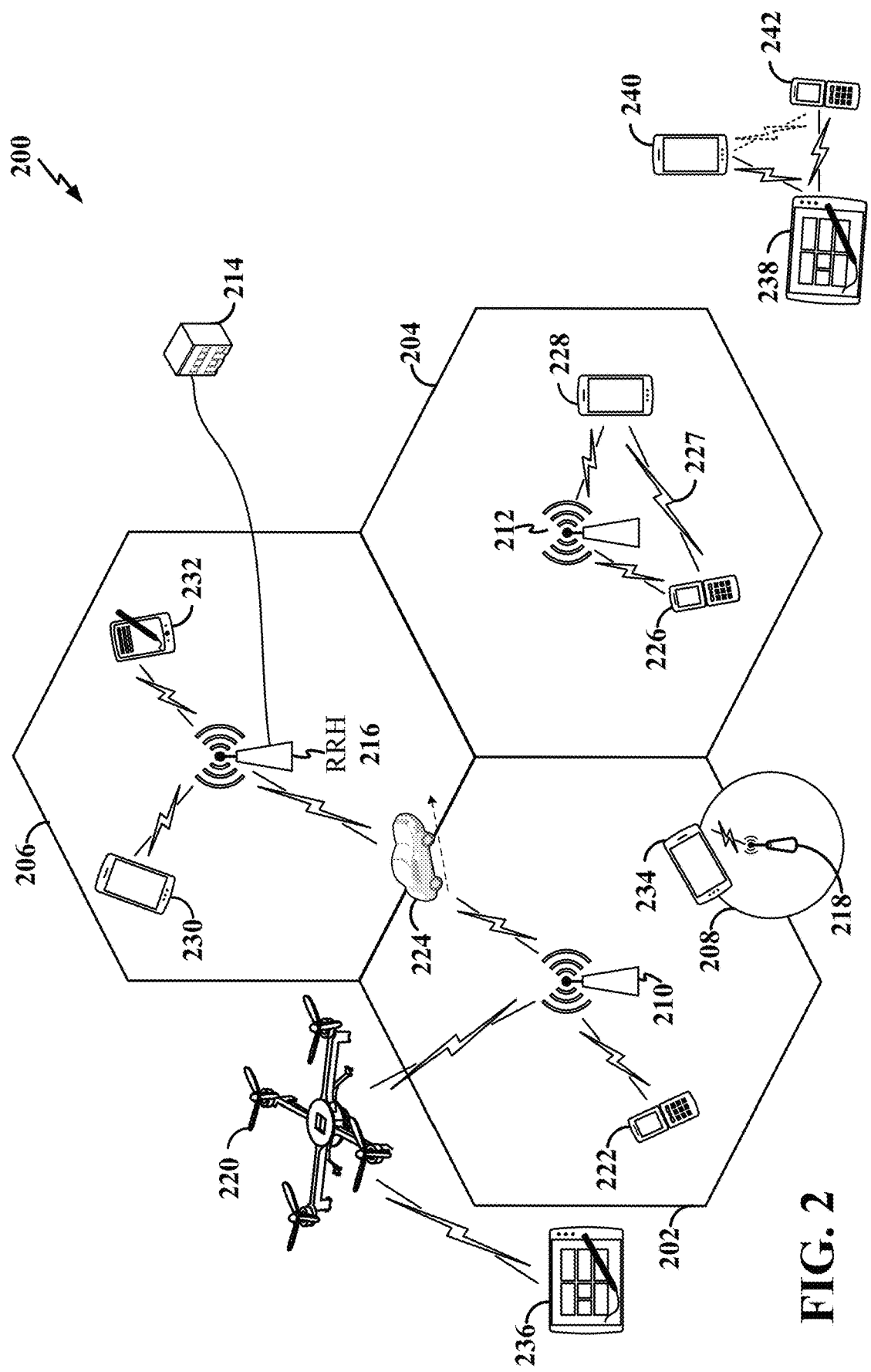
FIG. 2 is a conceptual illustration of an example of a radio access network according to some aspects.

Referring now to FIG. 2, by way of example and without limitation, a schematic illustration of a RAN 200 is provided. In some examples, the RAN 200 may be the same as the RAN 104 described above and illustrated in FIG. 1. The geographic area covered by the RAN 200 may be divided into cellular regions (cells) that can be uniquely identified by a user equipment (UE) based on an identification broadcasted from one access point or base station. FIG. 2 illustrates macrocells 202, 204, and 206, and a small cell 208, each of which may include one or more sectors (not shown). A sector is a sub-area of a cell. All sectors within one cell are served by the same base station. A radio link within a sector can be identified by a single logical identification belonging to that sector. In a cell that is divided into sectors, the multiple sectors within a cell can be formed by groups of antennas with each antenna responsible for communication with UEs in a portion of the cell.

Various base station arrangements can be utilized. For example, in FIG. 2, two base stations 210 and 212 are shown in cells 202 and 204, and a third base station 214 is shown controlling a remote radio head (RRH) 216 in cell 206. That is, a base station can have an integrated antenna or can be connected to an antenna or RRH by feeder cables. In the illustrated example, the cells 202, 204, and 206 may be referred to as macrocells, as the base stations 210, 212, and 214 support cells having a large size. Further, a base station 218 is shown in the small cell 208 (e.g., a microcell, picocell, femtocell, home base station, home Node B, home eNode B, etc.) which may overlap with one or more macrocells. In this example, the cell 208 may be referred to as a small cell, as the base station 218 supports a cell having a relatively small size. Cell sizing can be done according to system design as well as component constraints.

It is to be understood that the radio access network 200 may include any number of wireless base stations and cells. Further, a relay node may be deployed to extend the size or coverage area of a given cell. The base stations 210, 212, 214, 218 provide wireless access points to a core network for any number of mobile apparatuses. In some examples, the base stations 210, 212, 214, and/or 218 may be the same as the base station/scheduling entity 108 described above and illustrated in FIG. 1.

Within the RAN 200, the cells may include UEs that may be in communication with one or more sectors of each cell. Further, each base station 210, 212, 214, and 218 may be configured to provide an access point to a core network (e.g., as illustrated in FIG. 1) for all the UEs in the respective cells. For example, UEs 222 and 224 may be in communication with base station 210, UEs 226 and 228 may be in communication with base station 212, UEs 230 and 232 may be in communication with base station 214 by way of RRH 216, and UE 234 may be in communication with base station 218. In some examples, the UEs 222, 224, 226, 228, 230, 232, 234, 236, 238, 240, and/or 242 may be the same as the UE/scheduled entity 106 described above and illustrated in FIG. 1.

In some examples, an unmanned aerial vehicle (UAV) 220, which may be a drone or quadcopter, can be a mobile network node and may be configured to function as a UE.

For example, the UAV 220 may operate within cell 202 by communicating with base station 210. In some examples, a UAV 220 may be configured to function as a BS (e.g., serving a UE 236). That is, in some examples, a cell may not necessarily be stationary, and the geographic area of the cell may move according to the location of a mobile base station such as a UAV 220.

In the radio access network 200, the ability for a UE to communicate while moving, independent of its location, is referred to as mobility. The various physical channels between the UE and the radio access network are generally set up, maintained, and released under the control of an access and mobility management function (AMF). The AMF (not shown in FIG. 2) may include a security context management function (SCMF) that manages the security context for both the control plane and the user plane functionality, and a security anchor function (SEAF) that performs authentication.

A radio access network 200 may utilize DL-based mobility or UL-based mobility to enable mobility and handovers (i.e., the transfer of a UE's connection from one radio channel to another). In a network configured for DL-based mobility, during a call with a scheduling entity, or at any other time, a UE may monitor various parameters of the signal from its serving cell as well as various parameters of neighboring cells. Depending on the quality of these parameters, the UE may maintain communication with one or more of the neighboring cells. During this time, if the UE moves from one cell to another, or if signal quality from a neighboring cell exceeds that from the serving cell for a given amount of time, the UE may undertake a handoff or handover from the serving cell to the neighboring (target) cell. For example, UE 224 (illustrated as a vehicle, although any suitable form of UE may be used) may move from the geographic area corresponding to its serving cell 202 to the geographic area corresponding to a neighbor cell 206. When the signal strength or quality from the neighbor cell 206 exceeds that of the serving cell 202 for a given amount of time, the UE 224 may transmit a reporting message to its serving base station 210 indicating this condition. In response, the UE 224 may receive a handover command, and the UE may undergo a handover to the cell 206.

In a network configured for UL-based mobility, UL reference signals from each UE may be utilized by the network to select a serving cell for each UE. In some examples, the base stations 210, 212, and 214/216 may broadcast unified synchronization signals (e.g., unified Primary Synchronization Signals (PSSs), unified Secondary Synchronization Signals (SSSs) and unified Physical Broadcast Channels (PBCH)). The UEs 222, 224, 226, 228, 230, and 232 may receive the unified synchronization signals, derive the carrier frequency and slot timing from the synchronization signals, and in response to deriving timing, transmit an uplink pilot or reference signal. The uplink pilot signal transmitted by a UE (e.g., UE 224) may be concurrently received by two or more cells (e.g., base stations 210 and 214/216) within the radio access network 200. Each of the cells may measure a strength of the pilot signal, and the radio access network (e.g., one or more of the base stations 210 and 214/216 and/or a central node within the core network) may determine a serving cell for the UE 224. As the UE 224 moves through the radio access network 200, the network may continue to monitor the uplink pilot signal transmitted by the UE 224. When the signal strength or quality of the pilot signal measured by a neighboring cell exceeds that of the signal strength or quality measured by the serving cell, the network 200 may handover the UE 224 from the serving cell to the neighboring cell, with or without informing the UE 224.

Although the synchronization signal transmitted by the base stations 210, 212, and 214/216 may be unified, the synchronization signal may not identify a particular cell, but rather may identify a zone of multiple cells operating on the same frequency and/or with the same timing. The use of zones in 5G networks or other next generation communication networks enables the uplink-based mobility framework and improves the efficiency of both the UE and the network, since the number of mobility messages that need to be exchanged between the UE and the network may be reduced.

In various implementations, the air interface in the radio access network 200 may utilize licensed spectrum, unlicensed spectrum, or shared spectrum. Licensed spectrum provides for exclusive use of a portion of the spectrum, generally by virtue of a mobile network operator purchasing a license from a government regulatory body. Unlicensed spectrum provides for shared use of a portion of the spectrum without the need for a government-granted license. While compliance with some technical rules is generally still required to access unlicensed spectrum, generally, any operator or device may gain access. Shared spectrum may fall between licensed and unlicensed spectrum, wherein technical rules or limitations may be required to access the spectrum, but the spectrum may still be shared by multiple operators and/or multiple RATs. For example, the holder of a license for a portion of licensed spectrum may provide licensed shared access (LSA) to share that spectrum with other parties, e.g., with suitable licensee-determined conditions to gain access.

The electromagnetic spectrum is often subdivided, based on frequency/wavelength, into various classes, bands, channels, etc. In 5G NR two initial operating bands have been identified as frequency range designations FR1 (410 MHz-7.125 GHz) and FR2 (24.25 GHz-52.6 GHz). The frequencies between FR1 and FR2 are often referred to as mid-band frequencies. Although a portion of FR1 is greater than 6 GHz, FR1 is often referred to (interchangeably) as a "Sub-6 GHz" band in various documents and articles. A similar nomenclature issue sometimes occurs with regard to FR2, which is often referred to (interchangeably) as a "millimeter wave" band in documents and articles, despite being different from the extremely high frequency (EHF) band (30 GHz-300 GHz) which is identified by the International Telecommunications Union (ITU) as a "millimeter wave" band. The EHF band may include FR4 (e.g., covering 52.6 GHz-71 GHz) and at least part of FR5 (e.g., 95 GHz to 325 GHz).

With the above aspects in mind, unless specifically stated otherwise, it should be understood that the term "sub-6 GHz" or the like if used herein may broadly represent frequencies that may be less than 6 GHz, may be within FR1, or may include mid-band frequencies. Further, unless specifically stated otherwise, it should be understood that the term "millimeter wave" or the like if used herein may broadly represent frequencies that may include mid-band frequencies, may be within FR2, or may be within the EHF band.

The air interface in the radio access network 200 may utilize one or more multiplexing and multiple access algorithms to enable simultaneous communication of the various devices. For example, 5G NR specifications provide multiple access for UL transmissions from UEs 222 and 224 to base station 210, and for multiplexing for DL transmissions from base station 210 to one or more UEs 222 and 224, utilizing orthogonal frequency division multiplexing (OFDM) with a cyclic prefix (CP). In addition, for UL transmissions, 5G NR specifications provide support for discrete Fourier transform-spread-OFDM (DFT-s-OFDM) with a CP (also referred to as single-carrier FDMA (SC-FDMA)). However, within the scope of the present disclosure, multiplexing and multiple access are not limited to the above schemes, and may be provided utilizing time division multiple access (TDMA), code division multiple access (CDMA), frequency division multiple access (FDMA), sparse code multiple access (SCMA), resource spread multiple access (RSMA), or other suitable multiple access schemes. Further, multiplexing DL transmissions from the base station 210 to UEs 222 and 224 may be provided utilizing time division multiplexing (TDM), code division multiplexing (CDM), frequency division multiplexing (FDM), orthogonal frequency division multiplexing (OFDM), sparse code multiplexing (SCM), or other suitable multiplexing schemes.

The air interface in the radio access network 200 may further utilize one or more duplexing algorithms. Duplex refers to a point-to-point communication link where both endpoints can communicate with one another in both directions. Full-duplex means both endpoints can simultaneously communicate with one another. Half-duplex means only one endpoint can send information to the other at a time. Half-duplex emulation is frequently implemented for wireless links utilizing time division duplex (TDD). In TDD, transmissions in different directions on a given channel are separated from one another using time division multiplexing. That is, at some times the channel is dedicated for transmissions in one direction, while at other times the channel is dedicated for transmissions in the other direction, where the direction may change very rapidly, e.g., several times per slot. In a wireless link, a full-duplex channel generally relies on physical isolation of a transmitter and receiver, and suitable interference cancelation technologies. Full-duplex emulation is frequently implemented for wireless links by utilizing frequency division duplex (FDD) or spatial division duplex (SDD). In FDD, transmissions in different directions operate at different carrier frequencies. In SDD, transmissions in different directions on a given channel are separate from one another using spatial division multiplexing (SDM). In other examples, full-duplex communication may be implemented within unpaired spectrum (e.g., within a single carrier bandwidth), where transmissions in different directions occur within different sub-bands of the carrier bandwidth. This type of full-duplex communication may be referred to as sub-band full-duplex (SBFD), also known as flexible duplex.

In a further aspect of the RAN 200, sidelink signals may be used between UEs without necessarily relying on scheduling or control information from a base station. For example, two or more UEs (e.g., UEs 226 and 228) may communicate with each other using peer to peer (P2P) or sidelink signals 227 without relaying that communication through a base station (e.g., base station 212). In a further example, UE 238 is illustrated communicating with UEs 240 and 242. Here, the UE 238 may function as a scheduling entity or a primary sidelink device, and UEs 240 and 242 may function as a scheduled entity or a non-primary (e.g., secondary) sidelink device. In still another example, a UE may function as a scheduling entity in a device-to-device (D2D), peer-to-peer (P2P), or vehicle-to-vehicle (V2V) network, and/or in a mesh network. In a mesh network example, UEs 240 and 242 may optionally communicate directly with one another in addition to communicating with the UE 238 (e.g., functioning as a scheduling entity). Thus, in a wireless communication system with scheduled access to time-frequency resources and having a cellular configuration, a P2P configuration, or a mesh configuration, a scheduling entity and one or more scheduled entities may communicate utilizing the scheduled resources. In some examples, the sidelink signals 227 include sidelink traffic (e.g., a physical sidelink shared channel) and sidelink control (e.g., a physical sidelink control channel).

In some examples, two or more UEs (e.g., UEs 226 and 228) within the coverage area of a serving base station 212 may communicate with both the base station 212 using cellular signals and with each other using direct link signals (e.g., sidelink signals 227) without relaying that communication through the base station. In an example of a V2X network within the coverage area of the base station 212, the base station 212 and/or one or both of the UEs 226 and 228 may function as scheduling entities to schedule sidelink communication between UEs 226 and 228.

Figure 3:
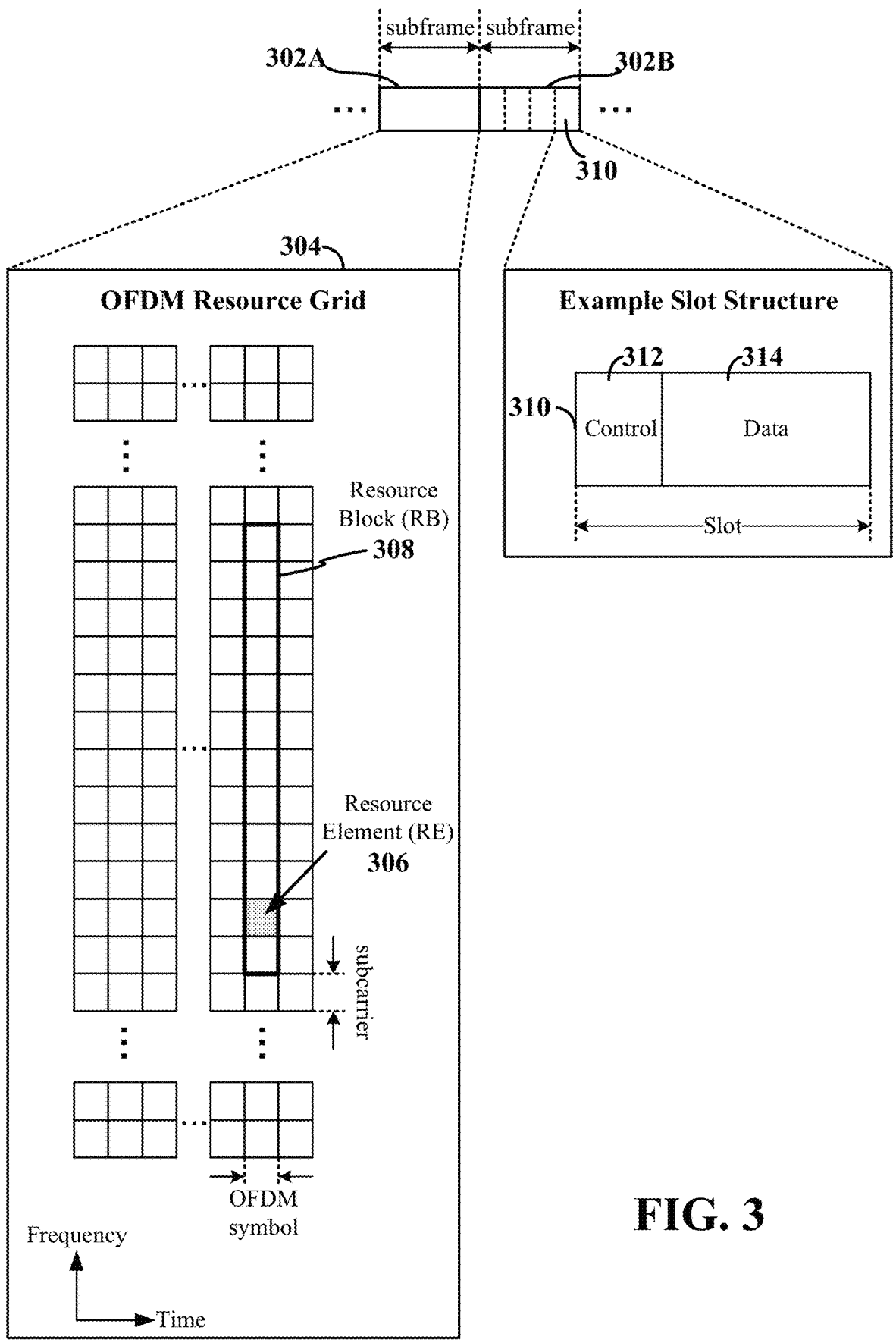
FIG. 3 is a schematic illustration of an example of wireless resources in an air interface utilizing orthogonal frequency divisional multiplexing (OFDM) according to some aspects.

Various aspects of the present disclosure will be described with reference to an OFDM waveform, an example of which is schematically illustrated in FIG. 3. It should be understood by those of ordinary skill in the art that the various aspects of the present disclosure may be applied to an SC-FDMA waveform in substantially the same way as described herein below. That is, while some examples of the present disclosure may focus on an OFDM link for clarity, it should be understood that the same principles may be applied as well to SC-FDMA waveforms.

Referring now to FIG. 3, an expanded view of an example DL subframe (SF) 302A is illustrated, showing an OFDM resource grid 304. However, as those skilled in the art will readily appreciate, the physical layer (PHY) transmission structure for any particular application may vary from the example described here, depending on any number of factors. Here, time is in the horizontal direction with units of OFDM symbols, and frequency is in the vertical direction with units of subcarriers. 5G NR supports a scalable numerology where different numerologies may be used for different radio frequency spectrums, different bandwidths, and the like. For example, sub-carrier spacings (SCSs) of 15 kHz, 30 kHz, 60 kHz, etc., may be used in different scenarios.

The resource grid 304 may be used to schematically represent time-frequency resources for a given antenna port. That is, in a multiple-input-multiple-output (MIMO) implementation with multiple antenna ports available, a corresponding multiple number of resource grids 304 may be available for communication. The resource grid 304 is divided into multiple resource elements (REs) 306. An RE, which is 1 subcarrier×1 symbol, is the smallest discrete part of the time-frequency grid, and contains a single complex value representing data from a physical channel or signal. Depending on the modulation utilized in a particular implementation, each RE may represent one or more bits of information. In some examples, a block of REs may be referred to as a physical resource block (PRB) or more simply a resource block (RB) 308, which contains any suitable number of consecutive subcarriers in the frequency domain. In one example, an RB may include 12 subcarriers, a number independent of the numerology used. In some examples, depending on the numerology, an RB may include any suitable number of consecutive OFDM symbols in the time domain Within the present disclosure, it is assumed that a single RB such as the RB 308 entirely corresponds to a single direction of communication (either transmission or reception for a given device).

Scheduling of UEs (e.g., scheduled entities) for downlink, uplink, or sidelink transmissions typically involves scheduling one or more resource elements 306 within one or more sub-bands or bandwidth parts (BWPs). Each BWP may include two or more contiguous or consecutive RBs. Thus, a UE generally utilizes only a subset of the resource grid 304. In some examples, an RB may be the smallest unit of resources that can be allocated to a UE. Thus, the more RBs scheduled for a UE, and the higher the modulation scheme chosen for the air interface, the higher the data rate for the UE. The RBs may be scheduled by a base station (e.g., gNB, eNB, RSU, etc.) or may be self-scheduled by a UE implementing D2D sidelink communication.

In this illustration, the RB 308 is shown as occupying less than the entire bandwidth of the subframe 302A, with some subcarriers illustrated above and below the RB 308. In a given implementation, the subframe 302A may have a bandwidth corresponding to any number of one or more RBs 308. Further, in this illustration, the RB 308 is shown as occupying less than the entire duration of the subframe 302A, although this is merely one possible example.

Each 1 ms subframe 302A may consist of one or multiple adjacent slots. In the example shown in FIG. 3, one subframe 302B includes four slots 310, as an illustrative example. In some examples, a slot may be defined according to a specified number of OFDM symbols with a given cyclic prefix (CP) length. For example, a slot may include 7 or 14 OFDM symbols with a nominal CP. Additional examples may include mini-slots having a shorter duration (e.g., one or two OFDM symbols). These mini-slots may in some cases be transmitted occupying resources scheduled for ongoing slot transmissions for the same or for different UEs. Any number of resource blocks may be utilized within a subframe or slot.

An expanded view of one of the slots 310 illustrates the slot 310 including a control region 312 and a data region 314. In general, the control region 312 may carry control channels (e.g., PDCCH), and the data region 314 may carry data channels (e.g., PDSCH or PUSCH). Of course, a slot may contain all DL, all UL, or at least one DL portion and at least one UL portion. The structure illustrated in FIG. 3 is merely an example, and different slot structures may be utilized, and may include one or more of each of the control region(s) and data region(s).

Although not illustrated in FIG. 3, the various REs 306 within a RB 308 may be scheduled to carry one or more physical channels, including control channels, shared channels, data channels, etc. Other REs 306 within the RB 308 may also carry pilots or reference signals, including but not limited to a demodulation reference signal (DMRS), a control reference signal (CRS), or a sounding reference signal (SRS). These pilots or reference signals may provide for a receiving device to perform channel estimation of the corresponding channel, which may enable coherent demodulation/detection of the control and/or data channels within the RB 308.

In some examples, a slot 310 may be utilized for broadcast or unicast communication. In V2X or D2D networks, a broadcast communication may refer to a point-to-multipoint transmission by a one device (e.g., a vehicle, base station (e.g., RSU, gNB, eNB, etc.), UE, or other similar device) to other devices. A unicast communication may refer to a point-to-point transmission by a one device to a single other device.

In an example, the control region 312 of the slot 310 may include a physical downlink control channel (PDCCH) including downlink control information (DCI) transmitted by a base station (e.g., gNB, eNB, RSU, etc.) towards one or more of a set of UEs, which may include one or more sidelink devices (e.g., V2X/D2D devices). In some examples, the DCI may include synchronization information to synchronize communication by a plurality of sidelink devices on the sidelink channel. In addition, the DCI may include scheduling information indicating one or more resource blocks within the control region 312 and/or data region 314 allocated to sidelink devices for sidelink communication. For example, the control region 312 of the slot may further include control information transmitted by sidelink devices over the sidelink channel, while the data region 314 of the slot 310 may include data transmitted by sidelink devices over the sidelink channel. In some examples, the control information may be transmitted within a physical sidelink control channel (PSCCH), while the data may be transmitted within a physical sidelink shared channel (PSSCH).

In a DL transmission (e.g., over the Uu interface), the transmitting device (e.g., the scheduling entity) may allocate one or more REs 306 (e.g., within a control region 312) to carry DL control information including one or more DL control channels, such as a PBCH, and/or a physical downlink control channel (PDCCH), etc., to one or more scheduled entities. The transmitting device may further allocate one or more REs 306 to carry other DL signals, such as a DMRS, a phase-tracking reference signal (PT-RS), a channel state information-reference signal (CSI-RS), a primary synchronization signal (PSS), and a secondary synchronization signal (SSS). The synchronization signals PSS and SSS, and in some examples, the PBCH and a PBCH DMRS, may be transmitted in a synchronization signal block (SSB). The SSB may be used to send system information (SI) and/or provide a reference to SI transmitted via another channel. Examples of system information may include, but are not limited to, subcarrier spacing, system frame number, a cell global identifier (CGI), a cell bar indication, a list of common control resource sets (coresets), a list of common search spaces, a search space for system information block 1 (SIB1), a paging search space, a random access search space, and uplink configuration information.

The PDCCH may carry downlink control information (DCI) including but not limited to power control commands, scheduling information, a grant, and/or an assignment of REs for DL and UL transmissions. The PHY carries HARQ feedback transmissions such as an acknowledgment (ACK) or negative acknowledgment (NACK). HARQ is a technique well-known to those of ordinary skill in the art, wherein the integrity of packet transmissions may be checked at the receiving side for accuracy, e.g., utilizing any suitable integrity checking mechanism, such as a checksum or a cyclic redundancy check (CRC). If the integrity of the transmission is confirmed, an ACK may be transmitted, whereas if not confirmed, a NACK may be transmitted. In response to a NACK, the transmitting device may send a HARQ retransmission, which may implement chase combining, incremental redundancy, etc.

In an UL transmission (e.g., over the Uu interface), the transmitting device (e.g., the scheduled entity) may utilize one or more REs 306 to carry UL control information including one or more UL control channels, such as a physical uplink control channel (PUCCH), to the scheduling entity. UL control information may include a variety of packet types and categories, including pilots, reference signals, and information configured to enable or assist in decoding uplink data transmissions. For example, the UL control information may include a DMRS or SRS. In some examples, the control information may include a scheduling request (SR), i.e., a request for the scheduling entity to schedule uplink transmissions. Here, in response to the SR transmitted on the control channel, the scheduling entity may transmit downlink control information that may schedule resources for uplink packet transmissions. UL control information may also include HARQ feedback, channel state feedback (CSF), or any other suitable UL control information.

In addition to control information, one or more REs 306 (e.g., within the data region 314) may be allocated for user data or traffic data. Such traffic may be carried on one or more traffic channels, such as, for a DL transmission, a PDSCH, or for an UL transmission, a physical uplink shared channel (PUSCH). In some examples, one or more REs 306 within the data region 314 may be configured to carry SIBs (e.g., SIB1), carrying system information that may enable access to a given cell.

The physical channels described above are generally multiplexed and mapped to transport channels for handling at the medium access control (MAC) layer. Transport channels carry blocks of information called transport blocks (TB). The transport block size (TBS), which may correspond to a number of bits of information, may be a controlled parameter, based on the modulation and coding scheme (MCS) and the number of RBs in a given transmission.

The channels or carriers described above with reference to FIGS. 1-3 are not necessarily all of the channels or carriers that may be utilized between a scheduling entity and scheduled entities, and those of ordinary skill in the art will recognize that other channels or carriers may be utilized in addition to those illustrated, such as other traffic, control, and feedback channels.

Figure 4:
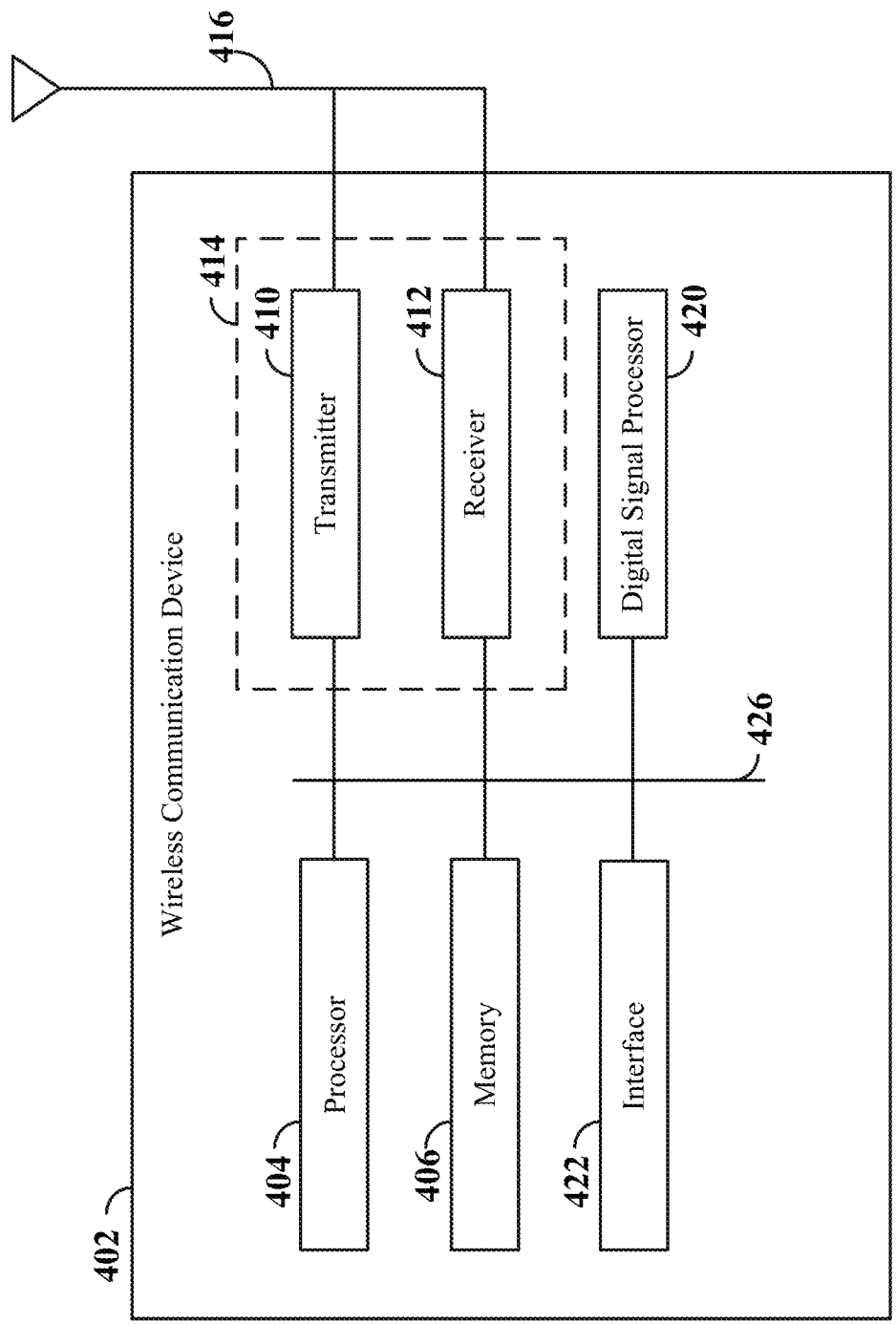
FIG. 4 is a block diagram of an example of a wireless communication device according to some aspects.

FIG. 4 illustrates several examples components of a wireless communication device 402 that may be deployed within the wireless communication system 100. The device 402 is an example of a device that may be configured to implement the various methods described herein. For example, the device 402 may be implemented as the UE 106 or the BS 108 of FIG. 1.

The device 402 may include a processor 404 that controls operation of the device 402. A memory 406 stores instructions and data for the processor 404. The device 402 may also include a transmitter 410 and a receiver 412 to allow transmission and reception of data between the device 402 and a remote location. The transmitter 410 and receiver 412 may be combined into single communication device (e.g., a transceiver 414). In some implementations (e.g., where the transceiver 414 is an RF transceiver), an antenna 416 (e.g., an antenna array) may be electrically coupled to the transceiver 414. The device 402 may also include (not shown) multiple transmitters, multiple receivers, multiple transceivers, and/or multiple antennas. The device 402 may also include a digital signal processor (DSP) 420 for use in processing signals. The DSP 420 may be configured to generate data blocks for transmission. The device 402 may further include an interface 422 (e.g., a user interface and/or a device interface). At least one signaling bus 426 may be used to communicatively couple the components of the device 402 in some examples.

For ease of reference, in the discussions of the transmit operations of the device 402 that follow, the device 402 may be referred to as a device 402t. Similarly, in the discussions of the receive operations of the device 402 that follow, the device 402 may be referred to as a device 402r.

Figure 5:
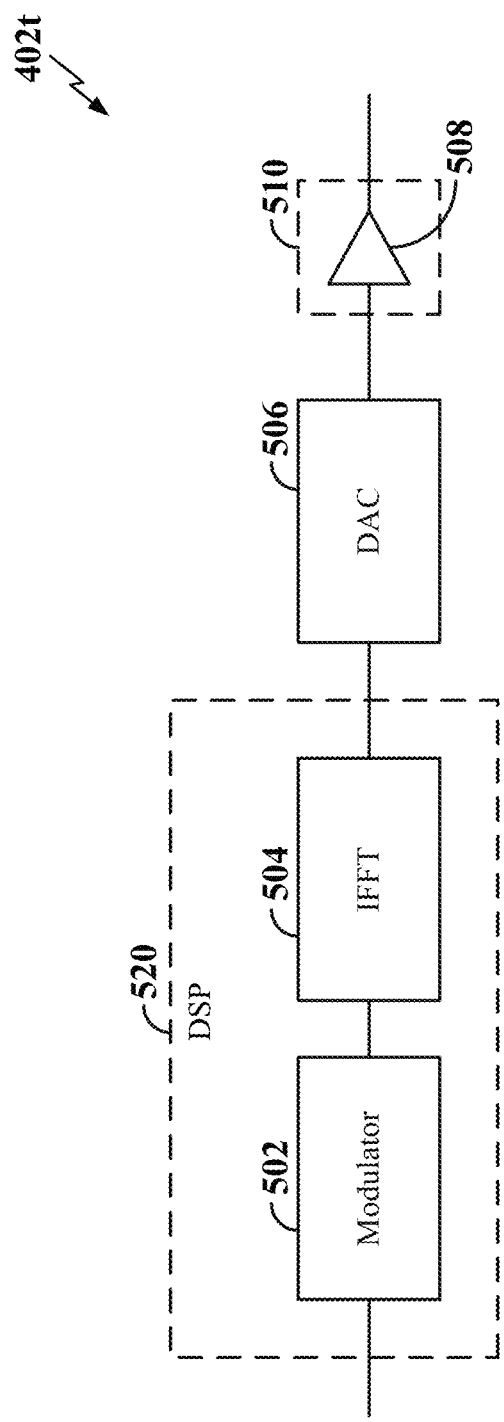
FIG. 5 is a block diagram of example components of the wireless communication device of FIG. 4 that may be used to transmit wireless communication signals according to some aspects.

FIG. 5 illustrates various components that may be utilized in the device 402t to transmit wireless signals. The device 402t of FIG. 5 may include a modulator 502 configured to modulate bits for transmission. For example, the modulator 502 may determine a plurality of symbols from bits received from the processor 404 (FIG. 4) or the interface 422 (FIG. 4), for example by mapping bits to a plurality of symbols according to a constellation. The bits may correspond to user data or to control information. In some aspects, the bits are received in codewords. In one example, the modulator 502 may include (e.g., may be) a QAM (quadrature amplitude modulation) modulator, for example, a 16-QAM modulator or a 64-QAM modulator. In other examples, the modulator 502 may include (e.g., may be) a binary phase-shift keying (BPSK) modulator, a quadrature phase-shift keying (QPSK) modulator, or an 8-PSK modulator. Other types of modulators may be used in other examples.

The device 402t may further include a transform module 504 configured to convert symbols or otherwise modulated bits from the modulator 502 into a time domain. In FIG. 5, the transform module 504 is illustrated as being implemented by an inverse fast Fourier transform (IFFT) module. Other types of transform modules may be used in other examples. In some implementations, there may be multiple transform modules (not shown) that transform units of data of different sizes. In some implementations, the transform module 504 may be itself configured to transform units of data of different sizes. For example, the transform module 504 may be configured with a plurality of modes, and may use a different number of points to convert the symbols in each mode. For example, the IFFT may have a mode where 52 points are used to convert symbols being transmitted over 52 tones (i.e., subcarriers) into a time domain, and a mode where 24 points are used to convert symbols being transmitted over 24 tones into a time domain. The number of points used by the transform module 504 may be referred to as the size of the transform module 504.

In FIG. 5, the modulator 502 and the transform module 504 are illustrated as being implemented in a DSP 520. In some aspects, however, one or both of the modulator 502 and the transform module 504 are implemented in the processor 404 or in another element of the device 402t (e.g., see description above with reference to FIG. 4).

The device 402t may further include a digital-to-analog converter (DAC) 506 configured to convert the output of the transform module into an analog signal. For example, the time-domain output of the transform module 504 may be converted to a baseband OFDM signal by the digital to analog converter 506. The digital to analog converter 506 may be implemented in the processor 404 or in another element of the device 402 of FIG. 4. In some aspects, the digital to analog converter 506 is implemented in the transceiver 414 (FIG. 4) or in a data transmit processor.

The analog signal may be wirelessly transmitted by the transmitter 510. The analog signal may be further processed before being transmitted by the transmitter 510, for example by being filtered or by being upconverted to an intermediate or carrier frequency. In the aspect illustrated in FIG. 5, the transmitter 510 includes a transmit amplifier 508. Prior to being transmitted, the analog signal may be amplified by the transmit amplifier 508. In some aspects, the amplifier 508 may include a low noise amplifier (LNA).

The transmitter 510 is configured to transmit one or more packets or data units in a wireless signal based on the analog signal. The packets or data units may be generated using the processor 404 (FIG. 4) and/or the DSP 520, for example using the modulator 502 and the transform module 504 as discussed above.

Figure 6:
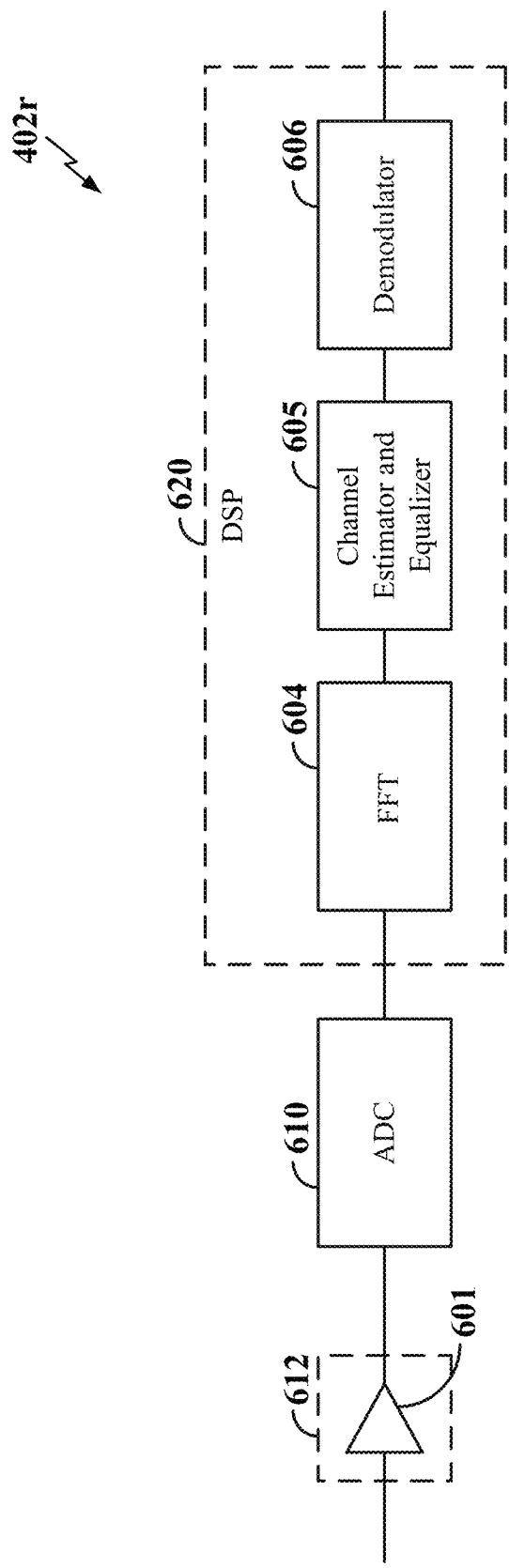
FIG. 6 is a block diagram of example components of the wireless communication device of FIG. 4 that may be used to receive wireless communication signals according to some aspects.

FIG. 6 illustrates various components that may be utilized in the device 402r to receive wireless signals. The components illustrated in FIG. 6 may be used, for example, to receive OFDM communication. For example, the components illustrated in FIG. 6 may be used to receive packets or data blocks transmitted by components similar to those discussed above with respect to FIG. 5.

In the examples of FIG. 6, the receiver 612 includes a receive amplifier 601. The receive amplifier 601 may be configured to amplify the wireless signal received by the receiver 612. In some aspects, the receiver 612 is configured to adjust the gain of the receive amplifier 601 using an automatic gain control (AGC) procedure. In some aspects, the amplifier 601 may include an LNA. In addition to being amplified, the wireless signal may be processed (e.g., by the receiver 612) before being converted by an analog-to-digital converter 610. For example, the wireless signal may be filtered and downconverted to an intermediate or baseband frequency.

The analog-to-digital converter (ADC) 610 is configured to convert an amplified wireless signal from the receiver 612 into a digital representation. The ADC 610 may be implemented in the processor 404 (FIG. 4) or in another element of the device 402r. In some examples, the ADC 610 is implemented in the transceiver 414 (FIG. 4) or in a data receive processor.

The ADC 610 periodically samples the continuous-time wireless signal to generate a discrete-time digital signal. Since this conversion involves quantization of the wireless signal, the resulting signal will include some amount of error and/or noise. The performance of the ADC 610 may be characterized by its bandwidth and signal-to-noise ratio (SNR). The bandwidth of the ADC 610 may be characterized by its sampling rate. The SNR of the ADC 610 reflects certain characteristics of the analog-to-digital conversion process such as resolution, linearity, accuracy (how well the quantization levels match the analog signal), aliasing and jitter. The SNR of the ADC 610 may be characterized as the effective number of bits (ENOB) of the ADC 610. In some examples, the ENOB corresponds to the number of bits of each measurement that are, on, average not noise. An ideal ADC has an ENOB equal to its resolution. The resolution of the ADC 610 indicates the number of different values the ADC 610 can produce over the allowed range of analog input values. The samples are stored electronically in binary form, so the resolution may be expressed as a bit depth. For example, an ADC with a resolution of 8 bits can encode an analog input to one of 256 different levels.

The device 402r may further include a transform module 604 configured to convert the representation of the wireless signal into a frequency spectrum. In FIG. 6, the transform module 604 is illustrated as being implemented by a fast Fourier transform (FFT) module. In some aspects, the transform module may identify a symbol for each point that it uses. As described above with reference to FIG. 5, the transform module 604 may be configured with a plurality of modes, and may use a different number of points to convert the signal in each mode. The number of points used by the transform module 604 may be referred to as the size of the transform module 604. In some aspects, the transform module 604 may identify a symbol for each point that it uses. Other types of transform modules may be used in other examples.

The device 402r may further include a channel estimator and equalizer 605 configured to form an estimate of the channel over which the data unit is received, and to remove certain effects of the channel based on the channel estimate. For example, the channel estimator and equalizer 605 may be configured to approximate a function of the channel, and the channel equalizer may be configured to apply an inverse of that function to the data in the frequency spectrum.

The device 402r may further include a demodulator 606 configured to demodulate the equalized data. For example, the demodulator 606 may determine a plurality of bits from symbols output by the transform module 604 and the channel estimator and equalizer 605, for example by reversing a mapping of bits to a symbol in a constellation. The bits may be processed or evaluated by the processor 404 (FIG. 4), or used to display or otherwise output information to the interface 422 (FIG. 4). In this way, data and/or information may be decoded. In some aspects, the bits correspond to codewords. In one aspect, the demodulator 606 may include a QAM (quadrature amplitude modulation) demodulator, for example an 8-QAM demodulator or a 64-QAM demodulator. In other aspects, the demodulator 606 may include a binary phase-shift keying (BPSK) demodulator or a quadrature phase-shift keying (QPSK) demodulator. Other types of demodulators may be used in other examples.

In FIG. 6, the transform module 604, the channel estimator and equalizer 605, and the demodulator 606 are illustrated as being implemented in a DSP 620. In some aspects, however, one or more of the transform module 604, the channel estimator and equalizer 605, and the demodulator 606 are implemented in the processor 404 (FIG. 4) or in another element of the device 402 (FIG. 4).

The device 402t shown in FIG. 5 is an example of a single transmit chain used for transmitting via an antenna and the device 402r shown in FIG. 6 is an example of a single receive chain used for receiving via an antenna. In some implementations, the device 402t or 402r may implement a portion of a multiple-input multiple-output (MIMO) system using multiple antennas to simultaneously transmit data via multiple streams and/or receive simultaneously transmit data via multiple streams.

The disclosure relates in some aspects to analog-to-digital conversion of an analog signal. In accordance with some aspects of the disclosure, the resolution (number of bits) and/or the quantization levels of an analog-to-digital converter that performs the analog-to-digital conversion may be configurable. In some examples, to enhance performance and/or to reduce power consumption, a device may report the number of bits and/or the quantization levels that it will use or a device may request that another device use a suggested number of bits and/or the quantization levels.

As used herein, the abbreviation ADC may refer to analog-to-digital conversion (e.g., when the term ADC is used as a verb) or to an analog-to-digital converter (e.g., when the term ADC is used as a noun.)

Figure 7:
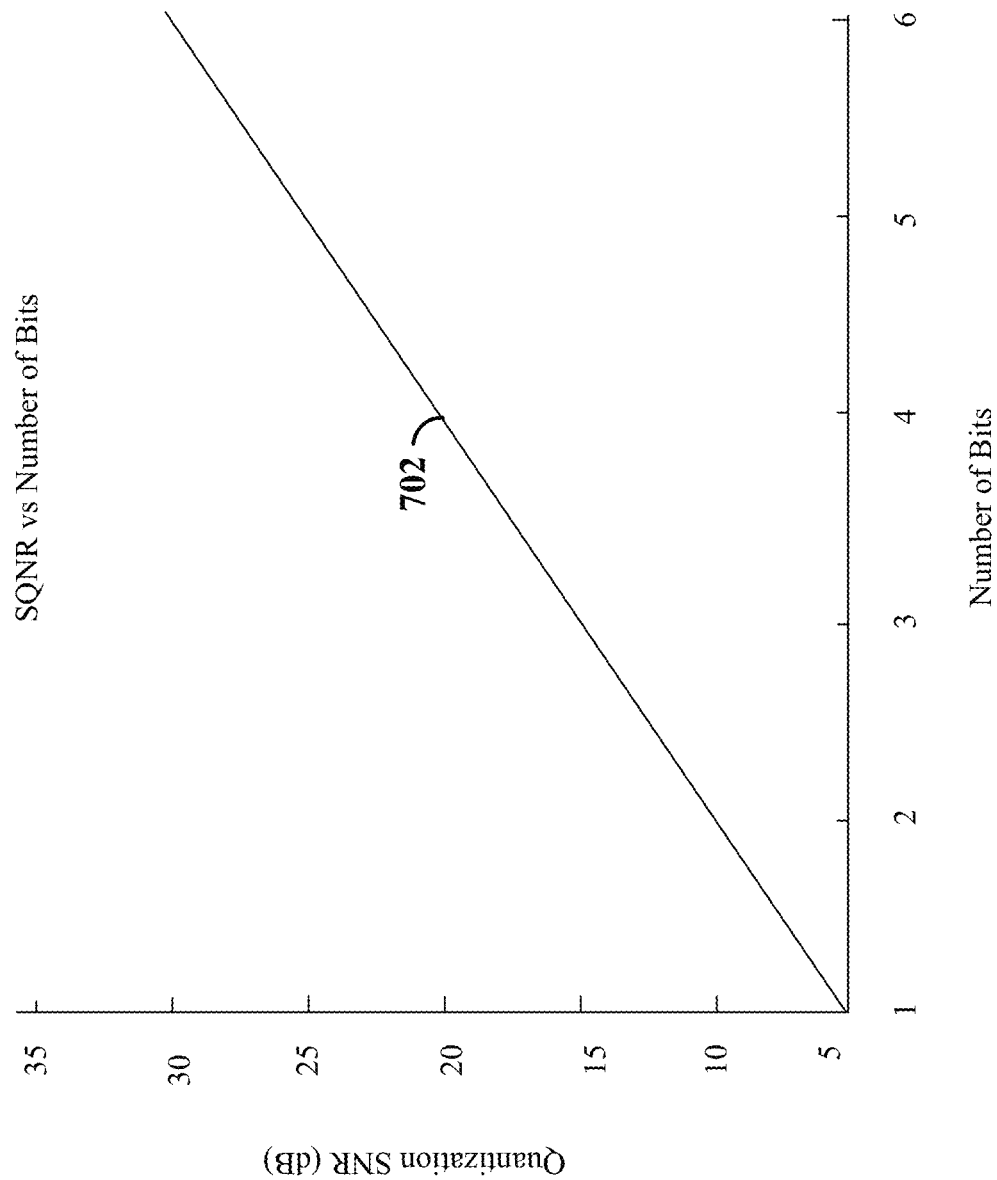
FIG. 7 is a graph illustrating an example of quantization signal-to-noise ratio versus number of analog-to-digital conversion bits according to some aspects.

FIG. 7 is a graph illustrating an example relationship between a quantization signal-to-noise ratio and a number of analog-to-digital conversion bits. As indicated by the curve 702, the quantization SNR (SQNR) increases as the number of bits used for the analog-to-digital conversion increases. Thus, an improvement in received signal quality may be achieved by using more bits.

Figure 8:
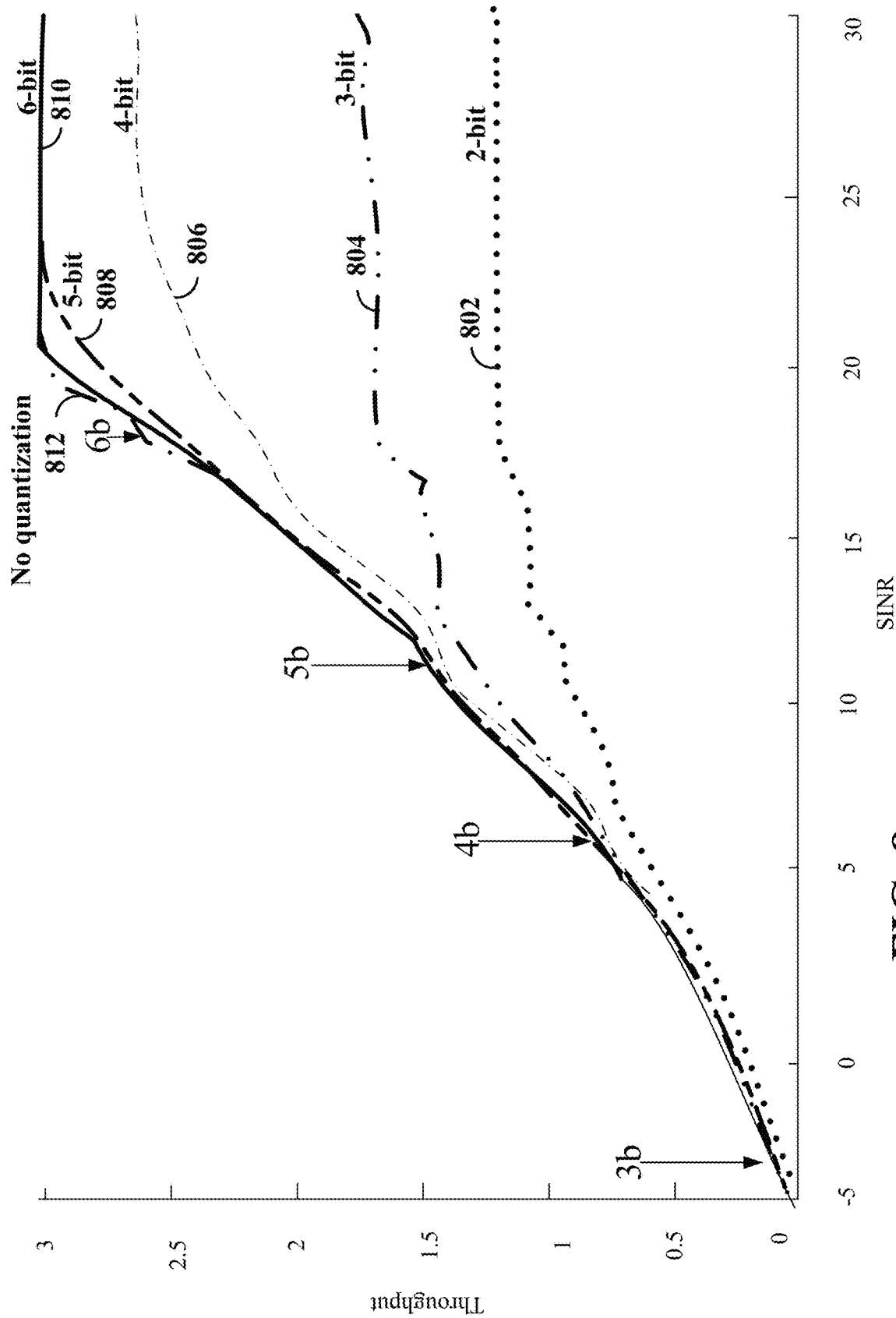
FIG. 8 is a graph illustrating an example of throughput versus a signal-to-interference-plus-noise ratio according to some aspects.

FIG. 8 is a graph illustrating an example relationship between throughput and signal-to-interference-plus-noise ratio (SINR). FIG. 8 depicts 6 curves. A first curve 802 illustrates the throughput verses SINR relationship when two bits are used for the analog-to-digital conversion. A second curve 804 illustrates the throughput verses SINR relationship when three bits are used for the analog-to-digital conversion. A third curve 806 illustrates the throughput verses SINR relationship when four bits are used for the analog-to-digital conversion. A fourth curve 808 illustrates the throughput verses SINR relationship when five bits are used for the analog-to-digital conversion. A fifth curve 810 illustrates the throughput verses SINR relationship when six bits are used for the analog-to-digital conversion. A sixth curve 812 illustrates the throughput verses SINR relationship when there is no quantization.

As illustrated in FIG. 8, for some levels of throughput (e.g., less than 1), a lower number of bits may provide an acceptable level of performance. Thus, power savings may be achieved at the device (e.g., a UE) by using fewer bits for the analog-to-digital conversion in these cases. FIG. 8 also illustrates, for scenarios with higher throughput requirements, that four bits (4 b), five bits (5 b), or six bits (6 b) may be needed to provide the desired level of performance.

The use of a low-resolution analog-to-digital converter (ADC) can significantly reduce power consumption. This power conservation occurs not only in the ADC, but also in the digital front-end (DFE) that follows the ADC since the DFE will process a lower bit width baseband signal.

Reducing the ADC and DFE power consumption may present a challenge in a some wireless communication systems (e.g., 5G-NR systems) that use relatively high bandwidth signals. As even wider bandwidths are used (e.g., systems that use bands such FR4 and FR5, 6G systems, and so on) the sampling frequency will increase as well. However, ADC power consumption is linear with respect to the sampling frequency.

The disclosure relates in some aspects to a dynamic approach for setting the ADC resolution to improve (e.g., optimize) the tradeoff between performance and power consumption. In some examples, a UE may send a report indicating the number of ADC bits, where this report may be used (e.g., by a BS) for dynamic optimization of the UE ADC. In some examples, a BS (e.g., a gNB) may transmit to a UE a request to use a specific number of ADC bits. This configuration of ADC bits may be used for dynamic optimization of the UE ADC.

The disclosure relates in some aspects to a dynamic ADC UE report. At connection establishment, the UE may report to the gNB the UE's capability to reconfigure the number of bits in the ADC. The UE may also report to the gNB the UE's capability to reconfigure the quantization levels in the ADC.

In some examples, the UE may select the number of bits and/or the quantization levels to be used for a subsequent (e.g., the next) received transmission and configure its ADC accordingly. For example, the UE may select one or both of these parameters based on SINR measured by the UE, RSRP measured by the UE, interference (e.g., mutual interference) measured by the UE, the remaining battery power at the UE, some other factor, or a combination of these factors.

A UE may report the configured number of bits to the BS. The reported number of bits can be an integer or a positive real number. In some examples, the reported number of bits represents the effective number of bits (ENOB) of the ADC. The UE may also report the configured ADC quantization levels for the reported number of bits. The UE may report the selected ADC parameter(s) via an RRC message, a MAC-CE, a UCI, a CSI report configuration message, or a combination thereof.

A BS (e.g., a gNB) can use the reported information to optimize the UE performance. For example, the BS may use tone reservation for reducing the quantization distortion. As another example, the BS may adjust the UE interferers according to the number of bits through the use of Inter-Cell Interference Coordination (ICIC). ICIC may be used, for example, to reduce the interference created by two or more cells.

As a further example, the BS may estimate (e.g., predict) whether a CRC operation at the UE will pass when the UE uses the configured number of bits. Here, the BS may use reported channel information and the reported number of bits and their quantization levels to simulate the UE modem. If the BS estimates that the CRC operation will not pass, the BS may take one or more actions to improve the UE performance such as link adaptation optimization, ICIC management, handoff of the UE, requesting the UE to use a different number of bits in the ADC, as a few examples. Other reported measurements (SINR, CQI, etc.) can be used in conjunction with the above operations to improve the UE performance.

As yet another example, a BS may use machine learning to improve the UE performance. For example, machine learning may be used to determine an amount of distortion (e.g., relative to ideal constellation points) to be added to a transmitted signal to improve the performance of UE when using the configured number of ADC bits. For example, the BS may test different configurations of communication parameters to identify a set of communication parameters that provides the best receive performance at the UE when the UE uses the configured number of bits and/or quantization levels.

As still another example, a BS may use the ADC configuration information to create side information that can assist the UE in signal reconstruction. For example, the BS may estimate how a received signal may be clipped and/or quantized at the UE. The BS may then generate information based on this estimate that the UE can use to better reconstruct the received signal.

The disclosure relates in some aspects to a BS determining the number of bits and/or quantization levels to be used by a UE's ADC. In this case, the BS may send a request to the UE for the UE to use the specified number of ADC bits. For example, the BS may transmit an RRC message, a DCI, or some other message to the UE that specifies a suggested number of bits to be used by the UE's ADC. This request may also include suggested ADC quantization levels for the suggested number of bits. In some examples, the BS may send this information to the UE via the DCI for optimized received signal quantization.

In some example, a BS may significantly improve the UE performance by estimating (e.g., predicting) the number of ADC bits that will result in a CRC operation passing at the UE and reporting this information to the UE.

In some examples, a BS may add distortion to the transmitted signal according to the suggested number of bits. For example, the BS may determine the amount of distortion that when added to a transmitted signal will improve the performance of UE when the UE uses the suggested number of ADC bits.

In some examples, a BS may estimate (e.g., predict) interference at the UE due to interferers in the vicinity of the UE (e.g., using ICIC, or some other method). The BS may then send a request to the UE to change the number of bits and the quantization levels to avoid or reduce clipping and/or aliasing effects at the UE.

Figure 9:
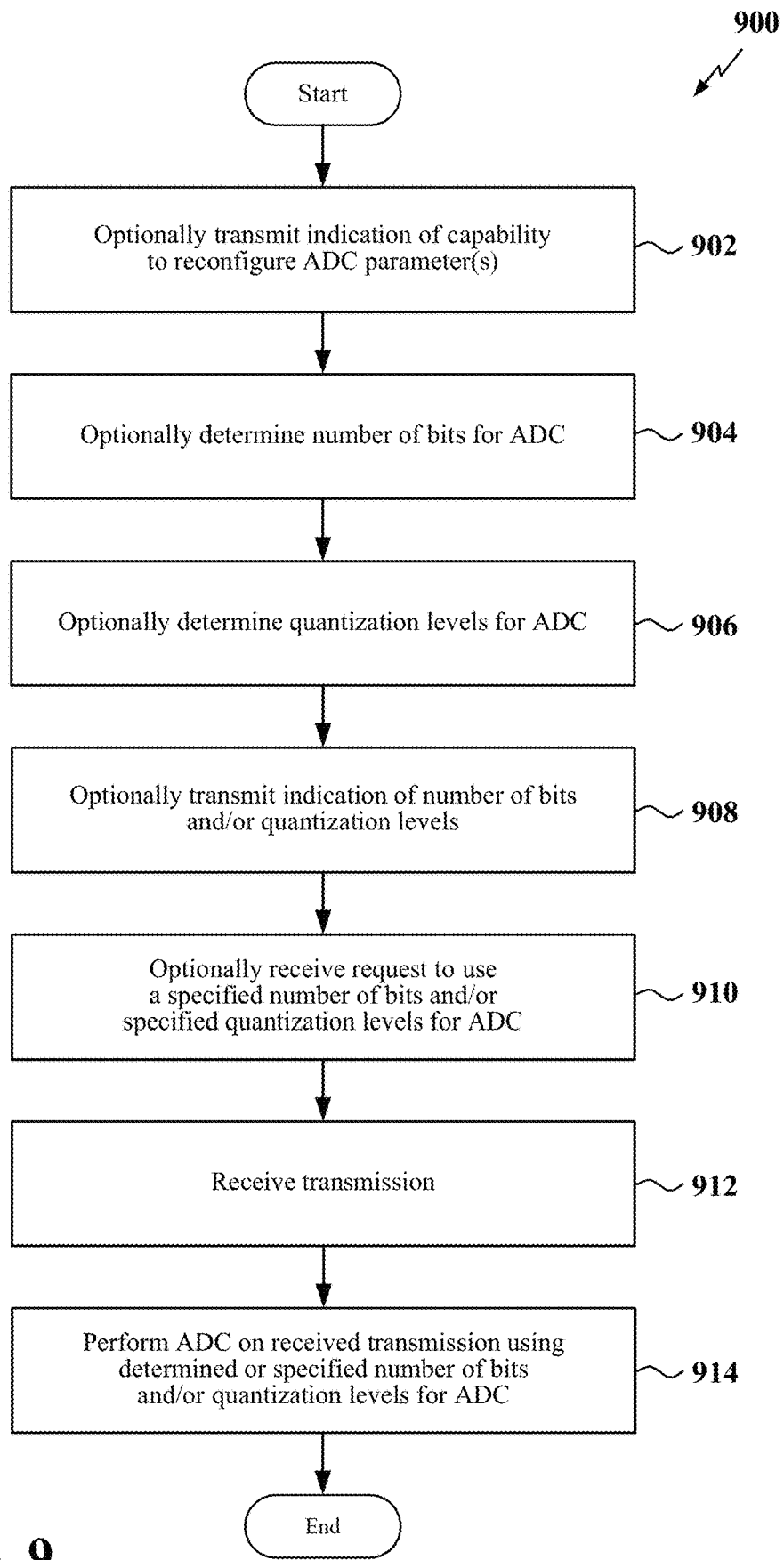
FIG. 9 is a flow chart illustrating an example analog-to-digital conversion method according to some aspects.

FIG. 9 is a flow chart illustrating an example wireless communication method 900 for a wireless communication device (e.g., a UE) in accordance with some aspects of the present disclosure. As described below, some or all illustrated features may be omitted in a particular implementation within the scope of the present disclosure, and some illustrated features may not be required for implementation of all embodiments. In some examples, the method 900 may be carried out by the UE 1300 illustrated in FIG. 13. In some examples, the method 900 may be carried out by any suitable apparatus or means for carrying out the functions or algorithm described below. For purposes of explanation, the operations that follow will be described as being performed by a UE. Other devices may perform these operations in other examples.

At optional block 902, a UE may transmit an indication of its capability to reconfigure at least one analog-to-digital converter parameter. For example, the UE may transmit a capability message that indicates that the number of bits of the analog-to-digital converter is configurable. As another example, the UE may transmit a capability message that indicates that quantization levels of the analog-to-digital converter are configurable.

At optional block 904, the UE may determine (e.g., autonomously determine) the number of bits for its analog-to-digital converter for an upcoming reception of a transmission from another device (e.g., a BS). The UE may make this determination periodically, whenever a change in SINR and/or RSRP (e.g., a change greater than a threshold amount) is detected, whenever a downlink transmission is scheduled, in response to a request, or in response to some other type of trigger.

In some examples, if an SINR and/or an RSRP measured by the UE is relatively high (e.g., higher than a threshold), the UE may select (e.g., elect to use) fewer ADC bits to conserve power. Conversely, if an SINR and/or an RSRP measured by the UE is relatively low (e.g., lower than a threshold), the UE may select (e.g., elect to use) more ADC bits to improve the performance of the UE's receiver. As another example, if an SINR and/or an RSRP measured by the UE is relatively low (e.g., lower than a threshold), then a lower rate (e.g., lower MCS) and simpler constellation (e.g., a lower order QAM) may be used for a transmission. In this case, UE may select (e.g., elect to use) fewer ADC bits to provide the desired throughput. In some examples, the UE measures the SINR and/or the RSRP from one or more of an SSB, a DMRS, a CSI-RS, any other UE dedicated channel (e.g., a new channel defined for ADC estimation), or a combination thereof received from a BS (e.g., a gNB).

In some examples, a BS (e.g., gNB) defines the maximum MCS and the minimum MCS to be used and sends a corresponding indication to the UE. The maximum/minimum MCS may influence the working number of ADC bits. For example, if the SINR is high, and if the gNB decides to transmit using MCS 0, then the UE can use a low number of ADC bits because the UE will decode a low MCS which does not require a high number of ADC bits. Thus, in some examples, the MCS may be an important input for the number of ADC bits report (e.g., the gNB can indicate to the UE the number of ADC bits to use in the next slot according to the MCS of the next slot).

In some examples, if interference at the UE (e.g., interference measured by the UE or estimated by another device) is relatively low (e.g., lower than a threshold), the UE may select (e.g., elect to use) fewer bits to conserve power. Conversely, if the interference at the UE is relatively high (e.g., higher than a threshold), the UE may select (e.g., elect to use) more bits to improve the performance of the UE's receiver.

In some examples, if the remaining battery power at the UE is relatively low (e.g., the battery voltage level is lower than a threshold), the UE may select (e.g., elect to use) fewer bits to conserve power. Conversely, if the remaining battery power at the UE is relatively high (e.g., the battery voltage level is higher than a threshold), the UE may select (e.g., elect to use) more bits to improve the performance of the UE's receiver.

At optional block 906, the UE may determine (e.g., autonomously determine) the quantization levels for its analog-to-digital converter for an upcoming reception of a transmission from another device (e.g., a BS). For example, the UE may determine that a scheduled transmission to the UE will include a certain type of traffic. The UE may then determine (e.g., based on learning conducted over time or information received from another device) that a certain set of quantization levels will result in better performance when receiving this type of traffic. Thus, the UE may select this set of quantization levels to receive the scheduled transmission.

At optional block 908, the UE may transmit an indication of the number of bits determined at block 904 and/or the quantization levels determined at block 906 to another device. For example, the UE may transmit this indication to a BS so that the BS can use this information to optimize the communication performance of the UE (e.g., as discussed in conjunction with FIG. 11 below).

At optional block 910, the UE may receive a request from another device to use a specified number of bits and/or specified quantization levels for the UE's analog-to-digital converter. For example, a BS may determine that communication performance at the UE will be improved and/or that battery power at the UE may be conserved by using a certain number of bits and/or certain quantization levels. In some examples, the request may be specific to a particular upcoming transmission by the BS (e.g., the next scheduled transmission). In some examples, the request may be applicable to all succeeding transmissions by the BS (e.g., the UE is to use the specified parameter(s) for a specified period of time or until the BS sends another request specifying a different number of bits and/or different quantization levels).

At block 912, the UE receives a transmission. For example, the UE may receive a downlink transmission from a BS that is serving the UE.

At block 914, the UE performs an analog-to-digital conversion on the received transmission. For example, the UE may use the number of bits selected at block 904 or the number of bits specified at block 910 for the analog-to-digital conversion. As another example, the UE may use the quantization levels selected at block 906 or the quantization levels specified at block 910 for the analog-to-digital conversion.

Figure 10:
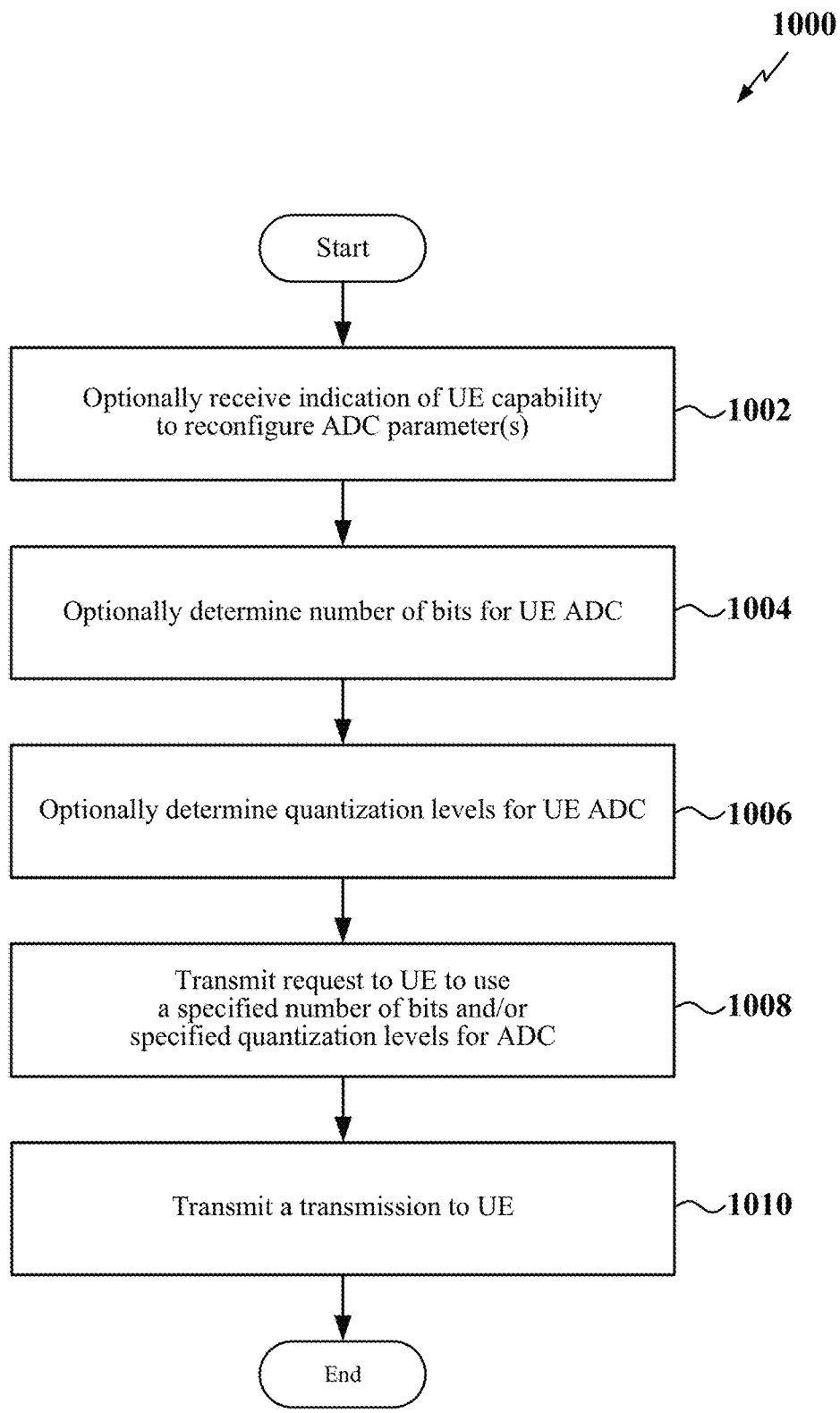
FIG. 10 is a flow chart illustrating an example method for configuring an analog-to-digital converter according to some aspects.

FIG. 10 is a flow chart illustrating an example wireless communication method 1000 for a wireless communication device (e.g., a BS) in accordance with some aspects of the present disclosure. As described below, some or all illustrated features may be omitted in a particular implementation within the scope of the present disclosure, and some illustrated features may not be required for implementation of all embodiments. In some examples, the method 1000 may be carried out by the BS 1500 illustrated in FIG. 15. In some examples, the method 1000 may be carried out by any suitable apparatus or means for carrying out the functions or algorithm described below. For purposes of explanation, the operations that follow will be described as being performed by a BS. Other devices may perform these operations in other examples.

At optional block 1002, a BS may receive an indication of a UE's capability to reconfigure at least one analog-to-digital converter parameter. For example, the BS may receive the capability message as described at block 902 of FIG. 9.

At optional block 1004, the BS may determine (e.g., autonomously determine) the number of bits for the UE to use for its analog-to-digital converter for an upcoming reception of a transmission by the BS. In some examples, the BS may estimate the number of bits needed for a CRC on the received transmission at the UE to pass (e.g., based on current channel conditions, the MCS for the transmission, etc.). In some examples, the BS may estimate interference at the UE and select a number of bits to mitigate associated clipping and/or aliasing effects at the UE.

At optional block 1006, the BS may determine (e.g., autonomously determine) the quantization levels for the UE to use for its analog-to-digital converter for an upcoming reception of a transmission by the BS. In some examples, the BS may estimate the quantization levels needed for a CRC on the received transmission at the UE to pass (e.g., based on current channel conditions, the MCS for the transmission, etc.). In some examples, the BS may estimate interference at the UE and select quantization levels to mitigate associated clipping and/or aliasing effects at the UE. As another example, the BS may identify (e.g., based on empirical information) the set of quantization levels best suited for a particular data block that will be transmitted to the UE.

At block 1008, the BS transmits a request to the UE to use the number of bits determined at block 1004 and/or the quantization levels determined at block 1006 for the UE's analog-to-digital converter. In some examples, the request may be specific to a particular upcoming transmission by the BS (e.g., the next scheduled transmission). In some examples, the request may be applicable to all succeeding transmissions by the BS for a period of time or until another request is sent.

At block 1010, the BS transmits a transmission to the UE. For example, this transmission may correspond to the transmission of block 912 of FIG. 9.

Figure 11:
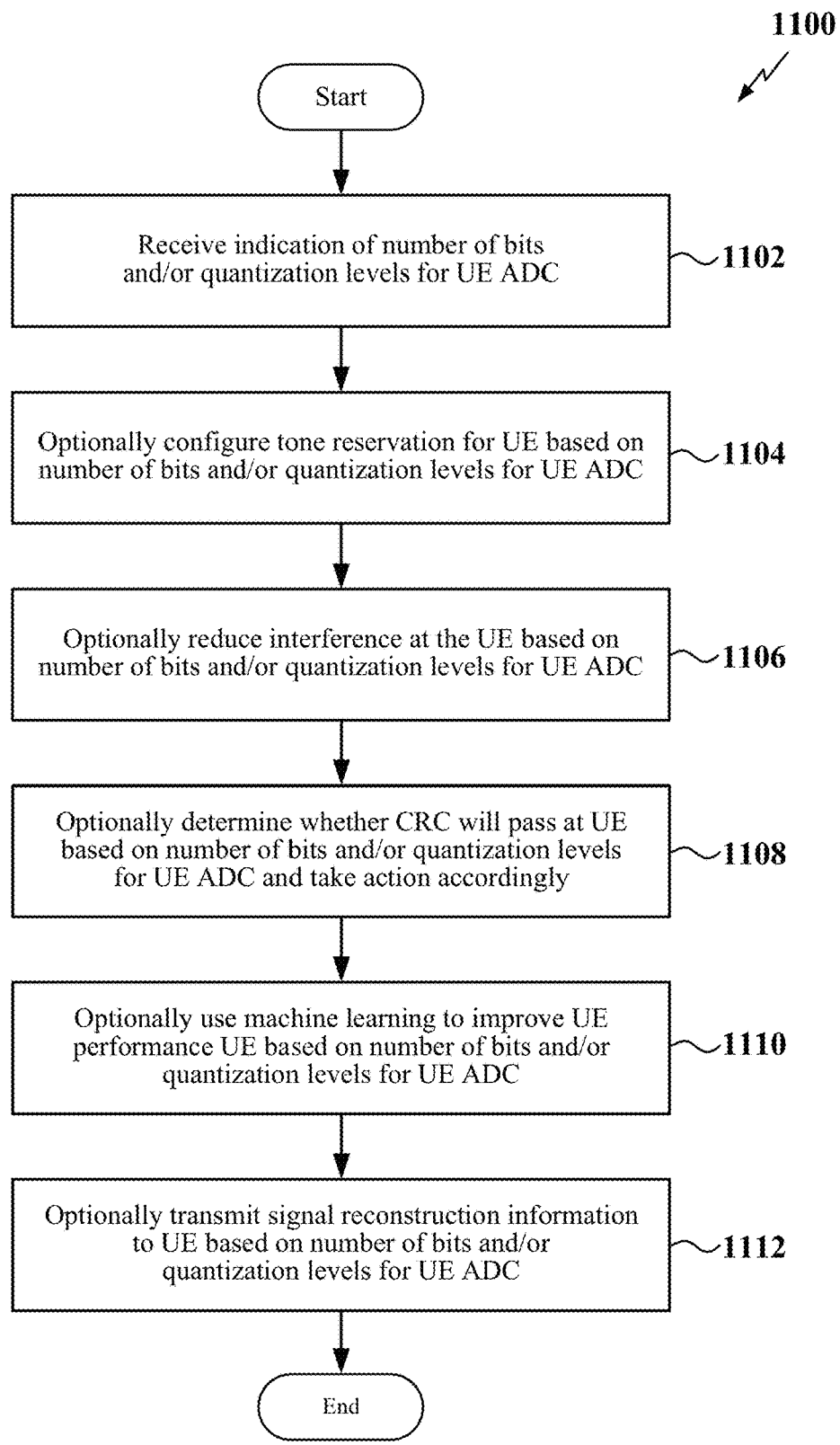
FIG. 11 is a flow chart illustrating an example method for optimizing UE performance based on an analog-to-digital converter configuration according to some aspects.

FIG. 11 is a flow chart illustrating an example wireless communication method 1100 for a wireless communication device (e.g., a BS) in accordance with some aspects of the present disclosure. As described below, some or all illustrated features may be omitted in a particular implementation within the scope of the present disclosure, and some illustrated features may not be required for implementation of all embodiments. In some examples, the method 1100 may be carried out by the BS 1500 illustrated in FIG. 15. In some examples, the method 1100 may be carried out by any suitable apparatus or means for carrying out the functions or algorithm described below. For purposes of explanation, the operations that follow will be described as being performed by a BS. Other devices may perform these operations in other examples.

At block 1102, a BS receives an indication of the number of bits and/or the quantization levels that a UE will used for an analog-to-digital conversion operation on a transmission from the BS. For example, the BS may receive the indication described at block 908 of FIG. 9.

At optional block 1104, the BS may configure a tone reservation for the UE based on the indicated number of bits and/or quantization levels. In a tone reservation scheme, some sub-carriers (so-called reserved tones) for a transmission are left empty, and the data is transmitted in the remaining sub-carriers. The reserved tones may be selected so that the time domain signal will have a lower quantization distortion. For example, the BS may estimate the distortion created from the quantization of a received signal at the UE when using the indicated number of bits and/or quantization levels. The BS may then select tone reservation locations for a transmission to the UE that results in the best performance in view of this distortion.

At optional block 1106, the BS may reduce interference at the UE based on the indicated number of bits and/or quantization levels. For example, the BS may determine whether a first UE that is near a second UE will interfere with the second UE (e.g., determine whether the UEs are operating in overlapping or adjacent frequency spectrum). If so, the BS may take action (e.g., perform an ICIC operation) to reduce the interference at the second UE. For example, the BS may cause the first UE to be scheduled on different RBs or on a different frequency band than the second UE.

At optional block 1108, the BS may determine whether CRC will pass at the UE when the UE uses the indicated number of bits and/or quantization levels. If not, the BS may perform link adaptation optimization (e.g., change the MCS used for a transmission), ICIC management (e.g., move interfering UEs to different RBs or frequency bands), a handoff (e.g., handoff the UE to a different beam or cell), or send a request to the UE to use a different number of bits and/or different quantization levels.

At optional block 1110, the BS may use machine learning to improve UE performance based on the indicated number of bits and/or quantization levels. In some examples, the BS may test different configurations of communication parameters to identify a set of communication parameters that provides the best receive performance at the UE when the UE uses the indicated number of bits and/or quantization levels. In some examples, the BS may identify an amount of distortion (e.g., via constellation extension) to add to a transmission to the UE that improves the performance of the UE when the UE uses the indicated number of bits and/or quantization levels.

At optional block 1112, the BS may transmit signal reconstruction information to the UE based on the indicated number of bits and/or quantization levels. For example, the BS may estimate how a received signal may be clipped and/or quantized at the UE. The BS may then determine information (e.g., locations and values of clipped samples and/or locations and values of peak samples) that the UE can use to better reconstruct the received signal.

Figure 12:
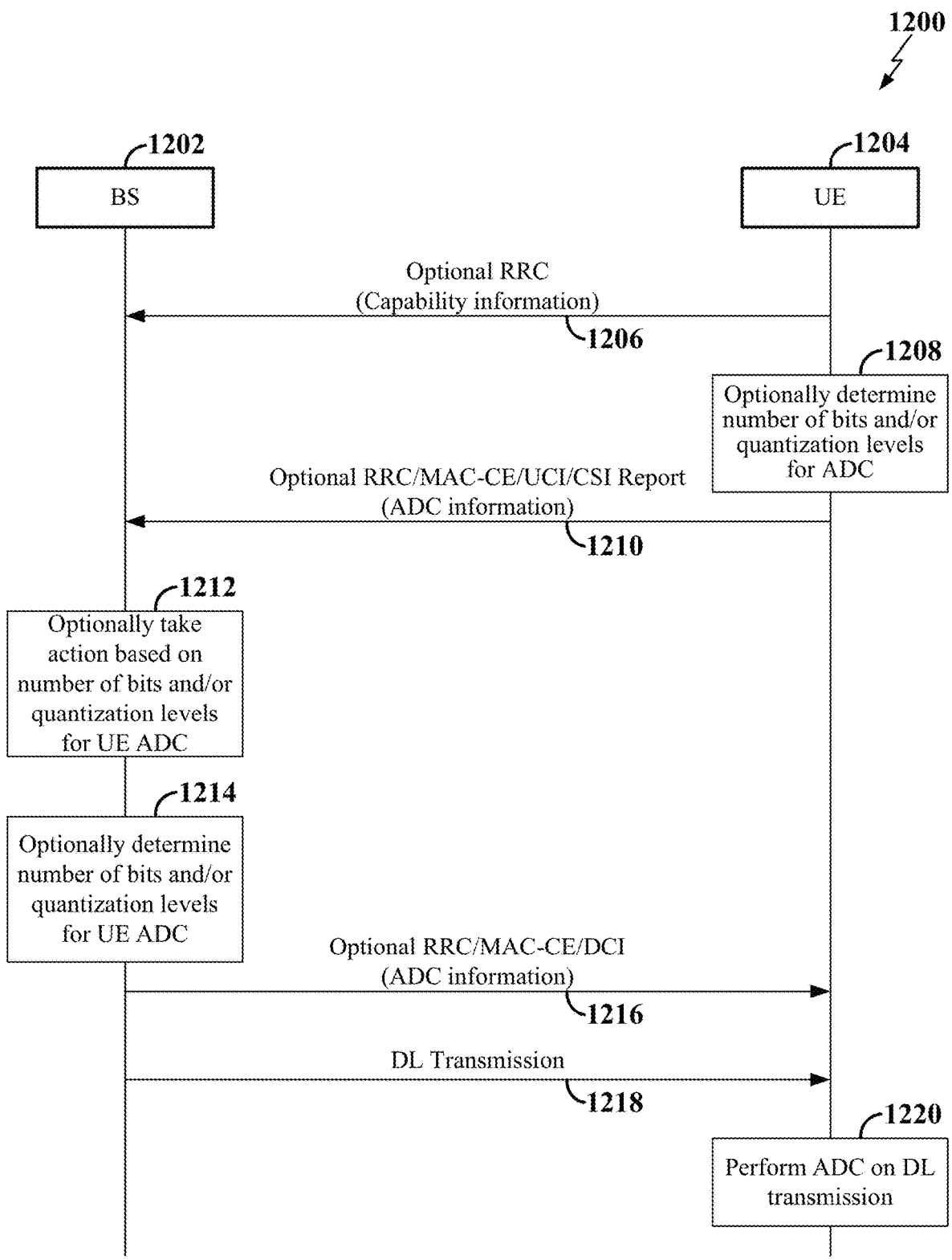
FIG. 12 is a signaling diagram illustrating an example of analog-to-digital conversion-related signaling according to some aspects.

FIG. 12 is a signaling diagram 1200 illustrating an example of signaling in a wireless communication system including a base station (BS) 1202 and a UE 1204. In some examples, the BS 1202 may correspond to any of the base stations or scheduling entities shown in any of FIGS. 1, 2, 4, and 15. In some examples, the UE 1204 may correspond to any of the UEs or scheduled entities shown in any of FIGS. 1, 2, 4, and 13.

At optional step 1206 of FIG. 12, the UE 1204 may transmit an RRC message that includes capability information. For example, the capability information may indicate that the number of bits and/or the quantization levels of the analog-to-digital converter of the UE 1204 is configurable.

At optional step 1208, the UE 1204 may determine the number of bits and/or quantization levels for its analog-to-digital converter. As discussed above, this determination may be based on, for example, one or more of received signal power at the UE 1204, interference at the UE 1204, remaining battery power at the UE 1204, or a combination thereof.

At optional step 1210, the UE 1204 may transmit an RRC message, a MAC-CE, a UCI, a CSI report, or some other message that indicates the analog-to-digital converter parameter(s) determined at step 1208.

At optional step 1212, the BS 1202 may take action based on the analog-to-digital converter parameter(s) received at step 1210. As discussed above, these actions may include one or more of configuring a tone reservation for a transmission to the UE 1204, mitigating interference at the UE 1204, determining whether CRC will pass at the UE 1204, link adaptation optimization, ICIC management, a handoff, a request to the UE to use a different number of bits and/or different quantization levels, machine learning to optimize UE performance, sending signal reconstruction information to the UE 1204, or a combination thereof.

At optional step 1214, the BS 1202 may select a number of bits and/or quantization levels for the analog-to-digital converter of the UE 1204. As discussed above, this selection may be based on, for example, one or more of an estimate of the number of bits needed for a CRC to pass at the UE 1204, interference at the UE 1204, a data block to be transmitted to the UE 1204, or a combination thereof.

At optional step 1216, the BS 1202 may transmit an RRC message, a MAC-CE, a DCI, or some other message that indicates the analog-to-digital converter parameter(s) determined at step 1214.

At step 1218, the BS 1202 transmits a downlink (DL) transmission to the UE 1204.

At step 1220, the UE 1204 performs an analog-to-digital conversion on the DL transmission. This analog-to-digital conversion may use the analog-to-digital converter parameter(s) determined at step 1208 or received at step 1216.

Figure 13:
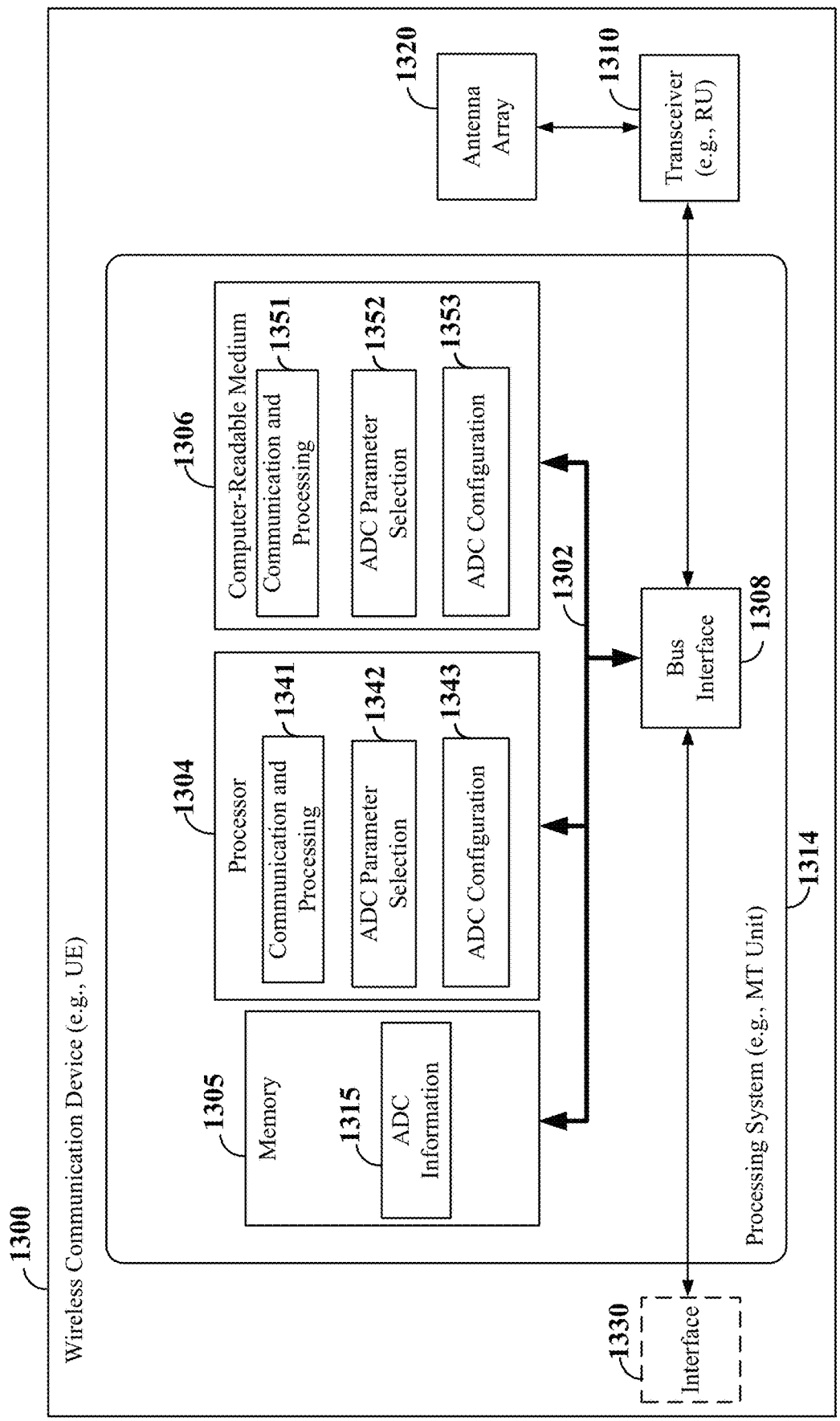
FIG. 13 is a block diagram illustrating an example of a hardware implementation for a user equipment employing a processing system according to some aspects.

FIG. 13 is a block diagram illustrating an example of a hardware implementation for a UE 1300 employing a processing system 1314. For example, the UE 1300 may be a device configured to wirelessly communicate with a base station, as discussed in any one or more of FIGS. 1-12. In some implementations, the UE 1300 may correspond to any of the UEs or scheduled entities shown in any of FIGS. 1, 2, 4, and 12.

In accordance with various aspects of the disclosure, an element, or any portion of an element, or any combination of elements may be implemented with the processing system 1314. The processing system 1314 may include one or more processors 1304. Examples of processors 1304 include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In various examples, the UE 1300 may be configured to perform any one or more of the functions described herein. That is, the processor 1304, as utilized in a UE 1300, may be used to implement any one or more of the processes and procedures described herein.

The processor 1304 may in some instances be implemented via a baseband or modem chip and in other implementations, the processor 1304 may include a number of devices distinct and different from a baseband or modem chip (e.g., in such scenarios as may work in concert to achieve embodiments discussed herein). And as mentioned above, various hardware arrangements and components outside of a baseband modem processor can be used in implementations, including RF-chains, power amplifiers, modulators, buffers, interleavers, adders/summers, etc.

In this example, the processing system 1314 may be implemented with a bus architecture, represented generally by the bus 1302. The bus 1302 may include any number of interconnecting buses and bridges depending on the specific application of the processing system 1314 and the overall design constraints. The bus 1302 communicatively couples together various circuits including one or more processors (represented generally by the processor 1304), a memory 1305, and computer-readable media (represented generally by the computer-readable medium 1306). The bus 1302 may also link various other circuits such as timing sources, peripherals, voltage regulators, and power management circuits, which are well known in the art, and therefore, will not be described any further. A bus interface 1308 provides an interface between the bus 1302 and a transceiver 1310 and between the bus 1302 and an interface 1330. The transceiver 1310 provides a communication interface or means for communicating with various other apparatus over a wireless transmission medium. In some examples, the UE may include two or more transceivers 1310, each configured to communicate with a respective network type (e.g., terrestrial or non-terrestrial). The interface 1330 provides a communication interface or means of communicating with various other apparatuses and devices (e.g., other devices housed within the same apparatus as the UE or other external apparatuses) over an internal bus or external transmission medium, such as an Ethernet cable. Depending upon the nature of the apparatus, the interface 1330 may include a user interface (e.g., keypad, display, speaker, microphone, joystick). Of course, such a user interface is optional, and may be omitted in some examples, such as an IoT device.

The processor 1304 is responsible for managing the bus 1302 and general processing, including the execution of software stored on the computer-readable medium 1306. The software, when executed by the processor 1304, causes the processing system 1314 to perform the various functions described below for any particular apparatus. The computer-readable medium 1306 and the memory 1305 may also be used for storing data that is manipulated by the processor 1304 when executing software. For example, the memory 1305 may store ADC information 1315 (e.g., bit number and quantization level information) used by the processor 1304 in cooperation with the transceiver 1310 for transmitting and/or receiving RACH messages.

One or more processors 1304 in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium 1306.

The computer-readable medium 1306 may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium 1306 may reside in the processing system 1314, external to the processing system 1314, or distributed across multiple entities including the processing system 1314. The computer-readable medium 1306 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

The UE 1300 may be configured to perform any one or more of the operations described herein (e.g., as described above in conjunction with FIGS. 1-12 and as described below in conjunction with FIG. 14). In some aspects of the disclosure, the processor 1304, as utilized in the UE 1300, may include circuitry configured for various functions.

The processor 1304 may include communication and processing circuitry 1341. The communication and processing circuitry 1341 may be configured to communicate with a base station, such as a gNB. The communication and processing circuitry 1341 may include one or more hardware components that provide the physical structure that performs various processes related to wireless communication (e.g., signal reception and/or signal transmission) as described herein. The communication and processing circuitry 1341 may further include one or more hardware components that provide the physical structure that performs various processes related to signal processing (e.g., processing a received signal and/or processing a signal for transmission) as described herein. In some examples, the communication and processing circuitry 1341 may include two or more transmit/receive chains, each configured to process signals in a different RAT (or RAN) type. The communication and processing circuitry 1341 may further be configured to execute communication and processing software 1351 included on the computer-readable medium 1306 to implement one or more functions described herein.

In some examples, the communication and processing circuitry 1341 may be configured to receive and process downlink beamformed signals at a mmWave frequency or a sub-6 GHz frequency via the transceiver 1310 and an antenna array 1320. For example, the communication and processing circuitry 1341 may be configured to receive a respective reference signal (e.g., SSB or CSI-RS) on each of a plurality of downlink beams from the base station during a downlink beam sweep via at least one first antenna panel of the antenna array 1320. The communication and processing circuitry 1341 may further be configured to transmit a beam measurement report to the base station.

In some examples, the communication and processing circuitry 1341 may further be configured to generate and transmit uplink beamformed signals at a mmWave frequency or a sub-6 GHz frequency via the transceiver 1310 and the antenna array 1320. For example, the communication and processing circuitry 1341 may be configured to transmit a respective reference signal (e.g., SRS or DMRS) on each of a plurality of uplink beams to the base station during an uplink beam sweep via at least one second antenna panel of the antenna array 1320.

The communication and processing circuitry 1341 may further be configured to generate and transmit a request to the base station. For example, the request may be included in a MAC-CE carried in a PUSCH, UCI in a PUCCH or PUSCH, a random access message, or an RRC message. The communication and processing circuitry 1341 may further be configured to generate and transmit a scheduling request (e.g., via UCI in a PUCCH) to the base station to receive an uplink grant for the PUSCH carrying the MAC-CE including the request.

The communication and processing circuitry 1341 may further be configured to generate and transmit an uplink signal on one or more uplink transmit beams applied to the uplink signal. The uplink signal may include, for example, a PUCCH, PUSCH, SRS, DMRS, or PRACH.

The communication and processing circuitry 1341 may further be configured to control the antenna array 1320 and the transceiver 1310 to search for and identify a plurality of downlink transmit beams during a downlink beam sweep. The communication and processing circuitry 1341 may further be configured to obtain a plurality of beam measurements on each of a plurality of downlink receive beams via the antenna array 1320 for each of the identified downlink transmit beams. The communication and processing circuitry 1341 may further be configured to generate a beam measurement report for transmission to the base station using the communication and processing circuitry 1341.

The communication and processing circuitry 1341 may further be configured to identify one or more selected uplink beam(s) based on the beam measurements obtained from the downlink beam reference signals. In some examples, the communication and processing circuitry 1341 may be configured to compare the respective RSRP (or other beam measurement) measured on each of the downlink receive beams for each of the serving downlink transmit beams to identify the serving downlink receive beams and to further utilize the serving downlink receive beams as the selected uplink transmit beams. Each serving downlink receive beam may have the highest measured RSRP (or other beam measurement) for one of the downlink transmit beams.

The communication and processing circuitry 1341 may be configured to generate one or more uplink transmit beams for transmission in an uplink beam sweep. Each uplink transmit beam may carry an uplink reference signal (e.g., an SRS) for measurement by the base station. The communication and processing circuitry 1341 may further be configured to identify the selected uplink transmit beam(s) selected by the base station based on the uplink beam measurements. For example, the communication and processing circuitry 1341 may be configured to receive an indication of the selected uplink transmit beam(s) from the base station.

In some implementations where the communication involves receiving information, the communication and processing circuitry 1341 may obtain information from a component of the UE 1300 (e.g., from the transceiver 1310 that receives the information via radio frequency signaling or some other type of signaling suitable for the applicable communication medium), process (e.g., decode) the information, and output the processed information. For example, the communication and processing circuitry 1341 may output the information to another component of the processor 1304, to the memory 1305, or to the bus interface 1308. In some examples, the communication and processing circuitry 1341 may receive one or more of signals, messages, other information, or any combination thereof. In some examples, the communication and processing circuitry 1341 may receive information via one or more channels. In some examples, the communication and processing circuitry 1341 may include functionality for a means for receiving. In some examples, the communication and processing circuitry 1341 may include functionality for a means for decoding.

In some implementations where the communication involves sending (e.g., transmitting) information, the communication and processing circuitry 1341 may obtain information (e.g., from another component of the processor 1304, the memory 1305, or the bus interface 1308), process (e.g., encode) the information, and output the processed information. For example, the communication and processing circuitry 1341 may output the information to the transceiver 1310 (e.g., that transmits the information via radio frequency signaling or some other type of signaling suitable for the applicable communication medium). In some examples, the communication and processing circuitry 1341 may send one or more of signals, messages, other information, or any combination thereof. In some examples, the communication and processing circuitry 1341 may send information via one or more channels. In some examples, the communication and processing circuitry 1341 may include functionality for a means for sending (e.g., a means for transmitting). In some examples, the communication and processing circuitry 1341 may include functionality for a means for encoding.

The processor 1304 may include ADC parameter selection circuitry 1342 configured to perform ADC parameter selection-related operations as discussed herein (e.g., one or more of the operations described in conjunction with FIGS. 7-12). The ADC parameter selection circuitry 1342 may include functionality for a means for determining a number of ADC bits (e.g., as described at block 904 of FIG. 9 and/or step 1208 of FIG. 12 and/or block 1402 of FIG. 14). The ADC parameter selection circuitry 1342 may include functionality for a means transmitting an indication of a number of ADC bits (e.g., as described at block 908 of FIG. 9 and/or step 1210 of FIG. 12 and/or block 1404 of FIG. 14). The ADC parameter selection circuitry 1342 may further be configured to execute ADC parameter selection software 1352 included on the computer-readable medium 1306 to implement one or more functions described herein.

The processor 1304 may include ADC configuration circuitry 1343 configured to perform ADC configuration-related operations as discussed herein (e.g., one or more of the operations described in conjunction with FIGS. 7-12). The ADC configuration circuitry 1343 may include functionality for a means for performing an analog-to-digital conversion (e.g., as described at block 914 of FIG. 9 and/or step 1220 of FIG. 12 and/or block 1406 of FIG. 14). The ADC configuration circuitry 1343 may further be configured to execute ADC configuration software 1353 included on the computer-readable medium 1306 to implement one or more functions described herein.

Figure 14:
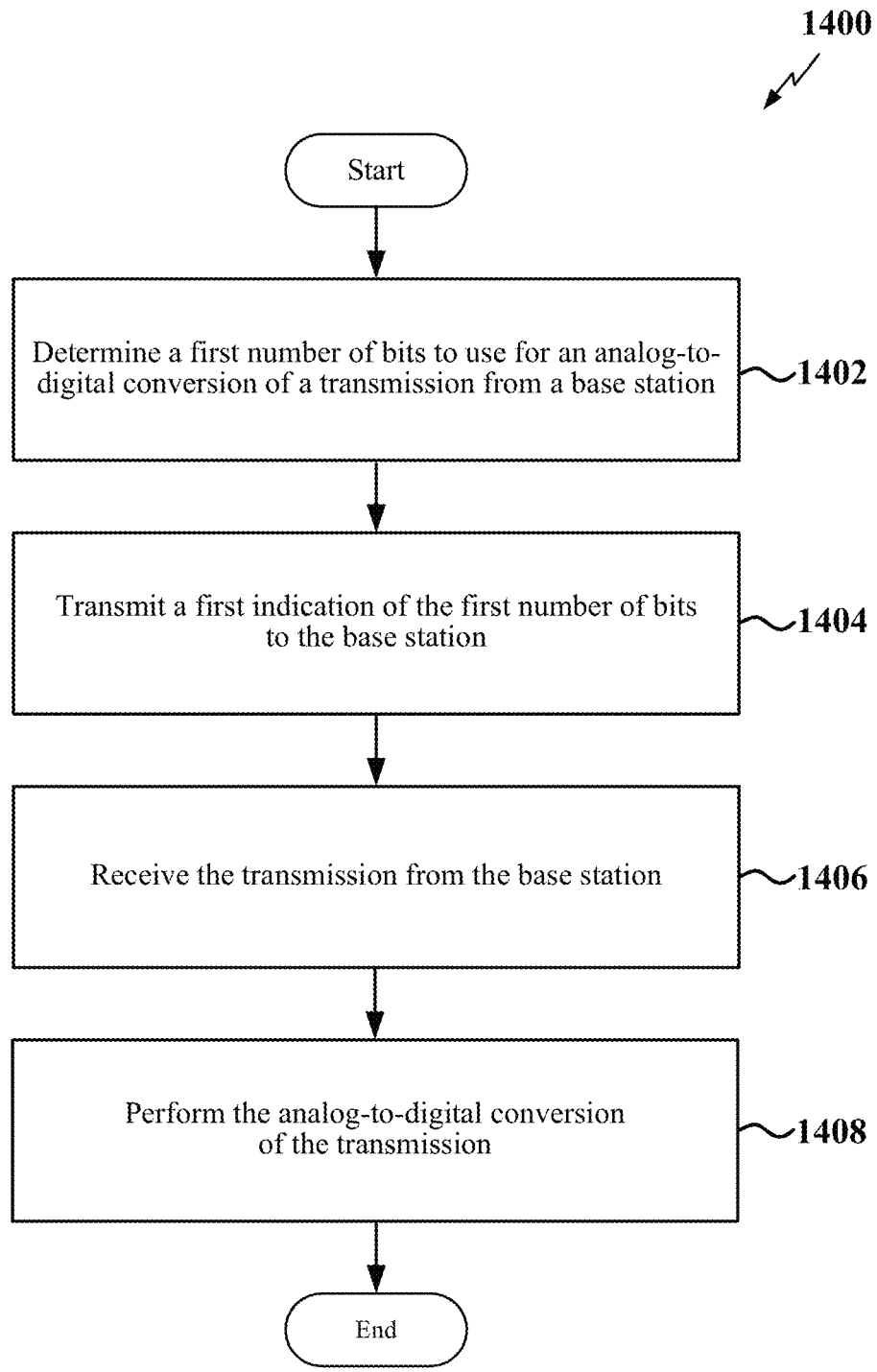
FIG. 14 is a flow chart illustrating an example analog-to-digital conversion method according to some aspects.

FIG. 14 is a flow chart illustrating an example wireless communication method 1400 according to some aspects of the disclosure. As described herein, some or all illustrated features may be omitted in a particular implementation within the scope of the present disclosure, and some illustrated features may not be required for implementation of all embodiments. In some examples, the method 1400 may be carried out by the UE 1300 illustrated in FIG. 13. In some examples, the method 1400 may be carried out by any suitable apparatus or means for carrying out the functions or algorithm described below.

At block 1402, a UE may determine a first number of bits to use for an analog-to-digital conversion of a transmission from a base station. For example, the ADC parameter selection circuitry 1342 optionally together with the communication and processing circuitry 1341 and the transceiver 1310, shown and described above in connection with FIG. 13, may monitor one or more conditions (e.g., received signal power, interference, battery life, etc.) at the UE. The ADC parameter selection circuitry 1342 may then calculate the number of ADC bits based on the monitored condition(s). As another example, the ADC parameter selection circuitry 1342 together with the communication and processing circuitry 1341 and the transceiver 1310, shown and described above in connection with FIG. 13, may monitor a designated channel (e.g., PDCCH or PDSCH) for a message that includes ADC configuration message from a gNB. The ADC parameter selection circuitry 1342 may then parse the message to determine whether the message specifies the number of ADC bits the UE is to use for an upcoming transmission by the gNB.

In some examples, determining the first number of bits may include measuring a reference signal received power (RSRP) or a signal-to-noise-plus interference ratio (SINR) of a signal received from the base station, and selecting the first number of bits based on the RSRP or the SINR. In some examples, determining the first number of bits may include measuring interference at the user equipment and selecting the first number of bits based on the interference. In some examples, determining the first number of bits may include determining remaining battery power at the user equipment and selecting the first number of bits based on the remaining battery power.

At block 1404, the UE may transmit a first indication of the first number of bits to the base station. For example, the ADC parameter selection circuitry 1342 may generate a message that indicates the number of ADC bits the UE will use for an upcoming transmission by the gNB. The ADC parameter selection circuitry 1342 together with the communication and processing circuitry 1341 and the transceiver 1310 may then transmit the message on a designated channel (e.g., PUCCH or PUSCH) to the gNB.

In some examples, transmitting the first indication may include transmitting the first indication via a channel state information (CSI) report message, a radio resource control (RRC) message, a medium access control-control element (MAC-CE), or an uplink control information (UCI). In some examples, the first indication specifies an effective number of bits for the analog-to-digital conversion.

At block 1406, the UE may receive the transmission from the base station. For example, the communication and processing circuitry 1341 and the transceiver 1310, shown and described above in connection with FIG. 13, may monitor a designated channel (e.g., PDSCH) for a scheduled data transmission from a gNB and decode any data received on that channel.

At block 1408, the UE may perform the analog-to-digital conversion of the transmission. For example, the ADC configuration circuitry 1343 together with the communication and processing circuitry 1341 and the transceiver 1310, shown and described above in connection with FIG. 13, may configure an analog-to-digital converter to use the number of ADC bits determined at block 1408 so that the analog-to-digital converter converts received analog data to digital data according to a desired resolution.

In some examples, the method may further include determining a plurality of quantization levels for the analog-to-digital conversion of the transmission. In some examples, the first indication specifies the plurality of quantization levels.

In some examples, the method may further include receiving a second indication from the base station. In some examples, the second indication specifies a second number of bits for the user equipment to use for the analog-to-digital conversion of the transmission, where the second number of bits is different from the first number of bits. In some examples, performing the analog-to-digital conversion of the transmission may include performing the analog-to-digital conversion of the transmission using the second number of bits.

In some examples, the method may further include receiving a second indication from the base station. In some examples, the second indication specifies a plurality of quantization levels for the user equipment to use for the analog-to-digital conversion of the transmission. In some examples, performing the analog-to-digital conversion of the transmission may include performing the analog-to-digital conversion of the transmission using the plurality of quantization levels.

In some examples, the method may further include receiving a second indication of a modulation and coding scheme. In some examples, the method may further include determining the first number of bits to use for the analog-to-digital conversion based on the second indication of the modulation and coding scheme.

Figure 15:
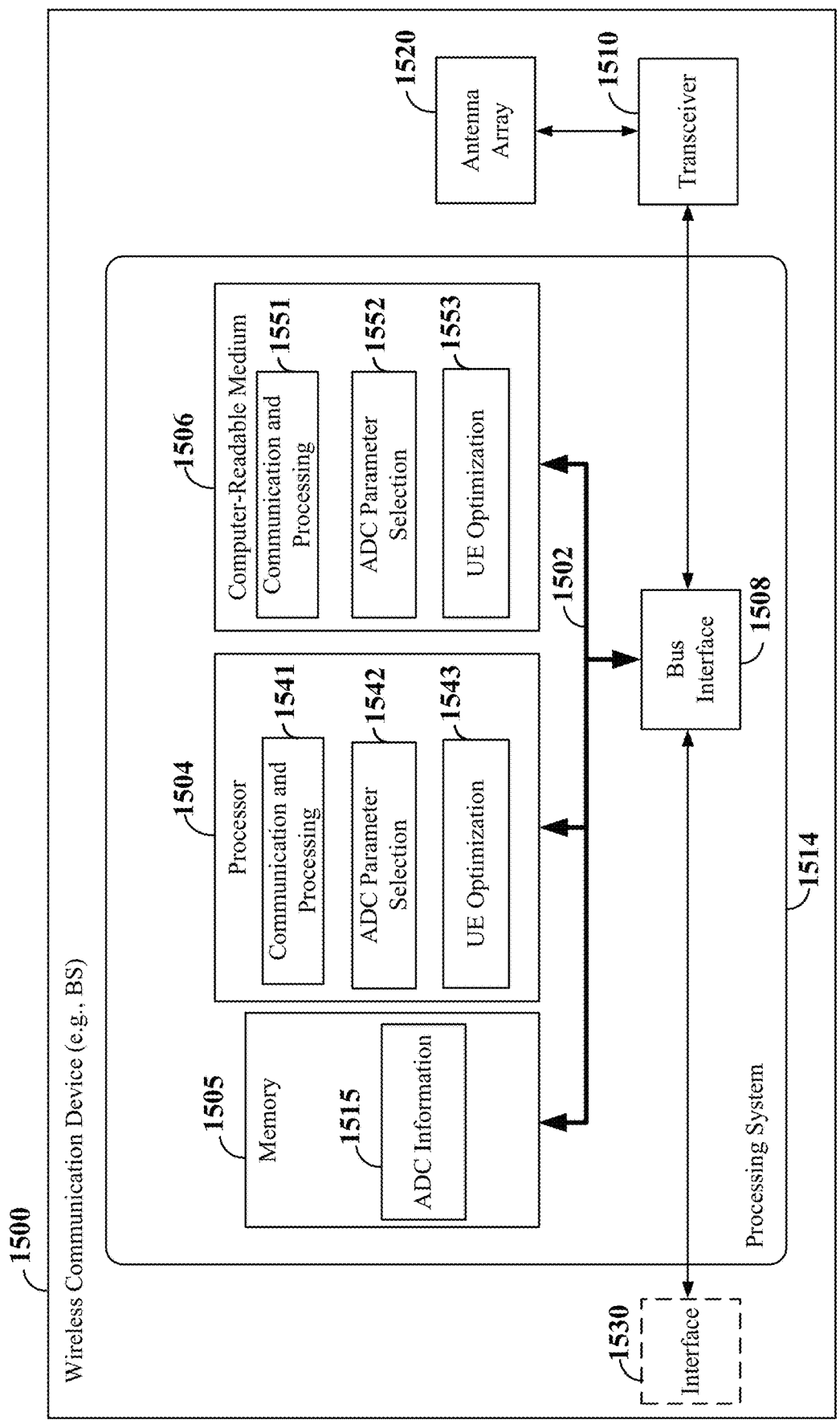
FIG. 15 is a block diagram illustrating an example of a hardware implementation for a base station employing a processing system according to some aspects.

FIG. 15 is a conceptual diagram illustrating an example of a hardware implementation for base station (BS) 1500 employing a processing system 1514. In some implementations, the BS 1500 may correspond to any of the BSs (e.g., gNBs) or scheduling entities shown in any of FIGS. 1, 2, 4, and 12.

In accordance with various aspects of the disclosure, an element, or any portion of an element, or any combination of elements may be implemented with the processing system 1514. The processing system may include one or more processors 1504. The processing system 1514 may be substantially the same as the processing system 1314 illustrated in FIG. 13, including a bus interface 1508, a bus 1502, memory 1505, a processor 1504, and a computer-readable medium 1506. The memory 1505 may store ADC information 1515 (e.g., bit number and quantization level information) used by the processor 1504 in cooperation with the transceiver 1510 for transmitting and/or receiving RACH messages. Furthermore, the BS 1500 may include an interface 1530 (e.g., a network interface) that provides a means for communicating with at least one other apparatus within a core network and with at least one radio access network.

The BS 1500 may be configured to perform any one or more of the operations described herein (e.g., as described above in conjunction with FIGS. 1-12 and as described below in conjunction with FIG. 16). In some aspects of the disclosure, the processor 1504, as utilized in the BS 1500, may include circuitry configured for various functions.

The processor 1504 may be configured to generate, schedule, and modify a resource assignment or grant of time-frequency resources (e.g., a set of one or more resource elements). For example, the processor 1504 may schedule time-frequency resources within a plurality of time division duplex (TDD) and/or frequency division duplex (FDD) subframes, slots, and/or mini-slots to carry user data traffic and/or control information to and/or from multiple UEs.

The processor 1504 may be configured to schedule resources for the transmission of downlink reference signals (e.g., SSBs or CSI-RSs) on a plurality of downlink beams for a downlink beam sweep in accordance with a selected downlink beam sweep type and selected number of downlink reference signal resources indicated in a request for uplink beam refinement received from a UE. The processor 1504 may further be configured to schedule resources for the uplink transmission of uplink reference signals (e.g., SRSs) on a plurality of uplink beams for an uplink beam sweep in accordance with a selected beam sweep type and selected number of uplink reference signal resources indicated in the request. The processor 1504 may further be configured to schedule resources that may be utilized by the UE to transmit the request. For example, the uplink beam refinement request resources may include resources scheduled for transmission of a PUCCH, PUSCH, PRACH occasion or RRC message. In some examples, the processor 1504 may be configured to schedule PUSCH resources for the uplink beam refinement request in response to receiving a scheduling request from the UE.

The processor 1504 may further be configured to schedule resources for the transmission of an uplink signal. In some examples, the resources may be associated with one or more uplink transmit beams and one or more corresponding receive beams applied to the uplink signal (e.g., based on the uplink BPLs) based on an indication of the uplink signal associated with the one or more uplink transmit beams included in the request. In some examples, the resources may be associated with an uplink transmission scheme indicating a number of uplink transmit beams to be utilized for the uplink signal, a number of repetitions per uplink transmit beam of the uplink signal, and a multiplexing scheme when more than one uplink transmit beam is used to transmit the uplink signal.

In some aspects of the disclosure, the processor 1504 may include communication and processing circuitry 1541. The communication and processing circuitry 1544 may be configured to communicate with a UE. The communication and processing circuitry 1541 may include one or more hardware components that provide the physical structure that performs various processes related to communication (e.g., signal reception and/or signal transmission) as described herein. The communication and processing circuitry 1541 may further include one or more hardware components that provide the physical structure that performs various processes related to signal processing (e.g., processing a received signal and/or processing a signal for transmission) as described herein. The communication and processing circuitry 1541 may further be configured to execute communication and processing software 1551 included on the computer-readable medium 1506 to implement one or more functions described herein.

In some examples, the communication and processing circuitry 1541 may be configured to receive and process uplink beamformed signals at a mmWave frequency or a sub-6 GHz frequency via the transceiver 1510 and an antenna array 1520. For example, the communication and processing circuitry 1541 may be configured to receive a respective reference signal (e.g., SRS or DMRS) on each of a plurality of uplink beams from the UE during an uplink beam sweep.

In some examples, the communication and processing circuitry 1541 may further be configured to generate and transmit downlink beamformed signals at a mmWave frequency or a sub-6 GHz frequency via the transceiver 1510 and the antenna array 1520. For example, the communication and processing circuitry 1541 may be configured to transmit a respective downlink reference signal (e.g., SSB or CSI-RS) on each of a plurality of downlink beams to the UE during a downlink beam sweep via at least one first antenna panel of the antenna array 1520. The communication and processing circuitry 1541 may further be configured to receive a beam measurement report from the UE.

The communication and processing circuitry 1541 may further be configured to receive a request from the UE. For example, the request may be included in a MAC-CE carried in a PUSCH, UCI in a PUCCH or PUSCH, a random access message, or an RRC message. The communication and processing circuitry 1541 may further be configured to receive a scheduling request (e.g., via UCI in a PUCCH) from the UE for an uplink grant for the PUSCH carrying the MAC-CE including the request for uplink beam refinement.

The communication and processing circuitry 1541 may further be configured to receive an uplink signal on one or more uplink receive beams via one or more uplink transmit beams applied to the uplink signal. For example, the communication and processing circuitry 1541 may be configured to receive the uplink signal on one or more uplink receive beams via at least one second antenna panel of the antenna array 1520. The uplink signal may include, for example, a PUCCH, PUSCH, SRS, DMRS, or PRACH.

The communication and processing circuitry 1541 may further be configured to control the antenna array 1520 and transceiver 1510 to generate a plurality of downlink transmit beams during a downlink beam sweep. The communication and processing circuitry 1541 may further be configured to receive a beam measurement report from the UE using the communication and processing circuitry 1544. The communication and processing circuitry 1541 may further be configured to identify one or more selected uplink beam(s) based on the beam measurements. In some examples, the communication and processing circuitry 1541 may be configured to compare the respective RSRP (or other beam measurement) measured on each of the downlink receive beams for each of the serving downlink transmit beams to identify the serving downlink receive beams and to further identify the serving downlink receive beams as the selected uplink transmit beams. Each serving downlink receive beam may have the highest measured RSRP (or other beam measurement) for one of the downlink transmit beams.

The communication and processing circuitry 1541 may be configured to receive one or more uplink transmit beams in an uplink beam sweep. Each uplink transmit beam may carry an uplink reference signal (e.g., an SRS) for measurement by the communication and processing circuitry 1541. The communication and processing circuitry 1541 may further be configured to obtain a plurality of beam measurements on each of a plurality of uplink receive beams of the antenna array 1520 for each of the uplink transmit beams. The communication and processing circuitry 1541 may further be configured to select the selected uplink transmit beam(s) and corresponding uplink receive beams forming respective uplink BPLs based on the uplink beam measurements.

In some implementations wherein the communication involves receiving information, the communication and processing circuitry 1541 may obtain information from a component of the BS 1500 (e.g., from the transceiver 1510 that receives the information via radio frequency signaling or some other type of signaling suitable for the applicable communication medium), process (e.g., decode) the information, and output the processed information. For example, the communication and processing circuitry 1541 may output the information to another component of the processor 1504, to the memory 1505, or to the bus interface 1508. In some examples, the communication and processing circuitry 1541 may receive one or more of signals, messages, other information, or any combination thereof. In some examples, the communication and processing circuitry 1541 may receive information via one or more channels. In some examples, the communication and processing circuitry 1541 may include functionality for a means for receiving. In some examples, the communication and processing circuitry 1541 may include functionality for a means for decoding.

In some implementations wherein the communication involves sending (e.g., transmitting) information, the communication and processing circuitry 1541 may obtain information (e.g., from another component of the processor 1504, the memory 1505, or the bus interface 1508), process (e.g., encode) the information, and output the processed information. For example, the communication and processing circuitry 1541 may output the information to the transceiver 1510 (e.g., that transmits the information via radio frequency signaling or some other type of signaling suitable for the applicable communication medium). In some examples, the communication and processing circuitry 1541 may send one or more of signals, messages, other information, or any combination thereof. In some examples, the communication and processing circuitry 1541 may send information via one or more channels. In some examples, the communication and processing circuitry 1541 may include functionality for a means for sending (e.g., a means for transmitting). In some examples, the communication and processing circuitry 1541 may include functionality for a means for encoding.

The processor 1504 may include ADC parameter selection circuitry 1542 configured to perform ADC parameter selection-related operations as discussed herein (e.g., one or more of the operations described in conjunction with FIGS. 7-12). The ADC parameter selection circuitry 1542 may include functionality for a means for determining a number of ADC bits (e.g., as described at block 1004 of FIG. 10 and/or step 1214 of FIG. 12 and/or block 1602 of FIG. 16). The ADC parameter selection circuitry 1542 may include functionality for a means transmitting an indication of a number of ADC bits (e.g., as described at block 1008 of FIG. 10 and/or step 1216 of FIG. 12 and/or block 1604 of FIG. 16). The ADC parameter selection circuitry 1542 may further be configured to execute ADC parameter selection software 1552 included on the computer-readable medium 1506 to implement one or more functions described herein.

The processor 1504 may include UE optimization circuitry 1543 configured to perform UE optimization-related operations as discussed herein (e.g., one or more of the operations described in conjunction with FIGS. 7-12). The UE optimization circuitry 1543 may include functionality for a means for transmitting a transmission to a UE (e.g., as described at block 1010 of FIG. 10 and/or step 1218 of FIG. 12 and/or block 1606 of FIG. 16). The UE optimization circuitry 1543 may include functionality for a means for one or more of configuring a tone reservation, reducing interference, determining whether a UE will pass CRC, using machine learning, transmitting signal reconstruction information, or a combination thereof (e.g., as described at blocks 1104-1112 of FIG. 11). The UE optimization circuitry 1543 may further be configured to execute UE optimization software 1553 included on the computer-readable medium 1506 to implement one or more functions described herein.

Figure 16:
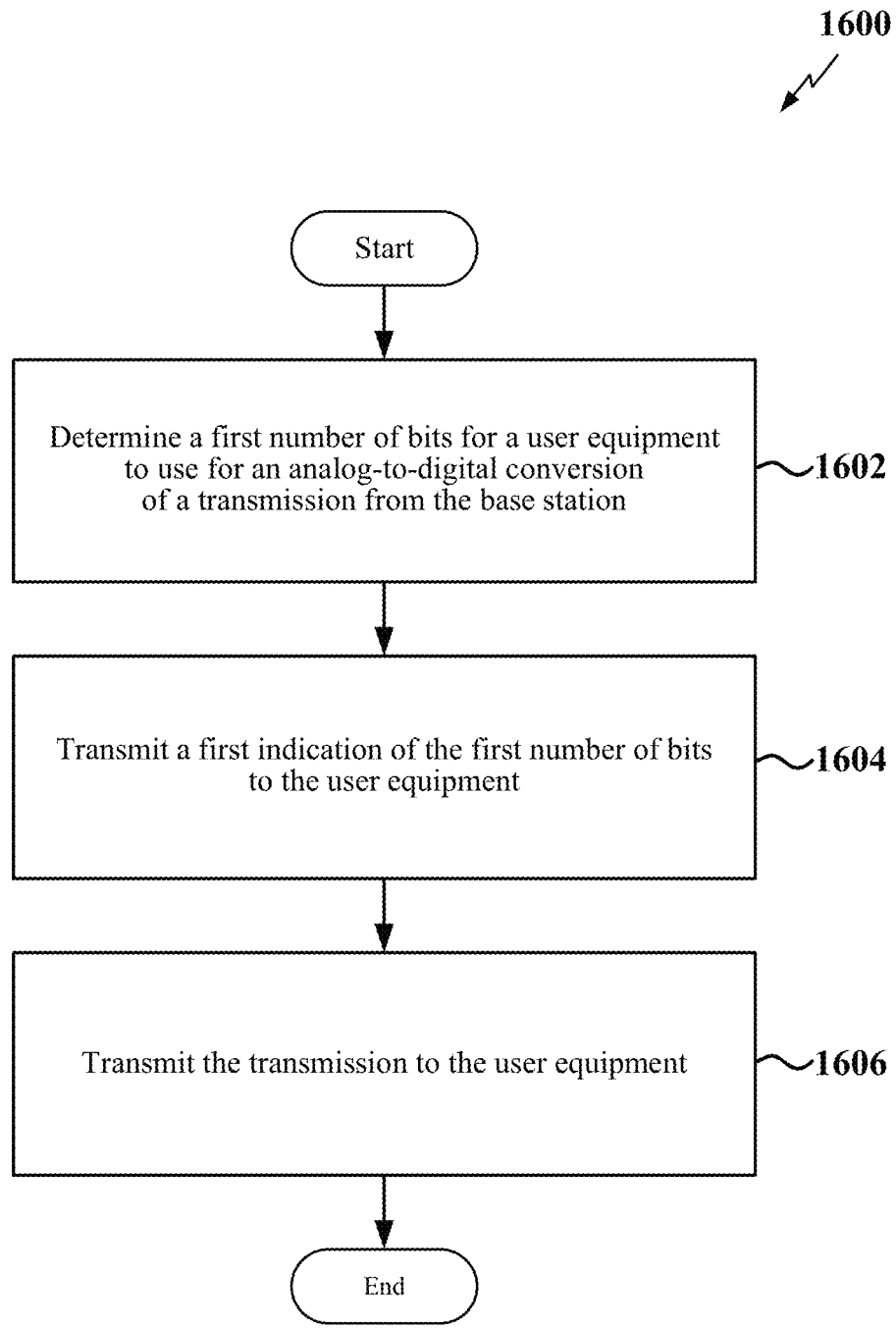
FIG. 16 is a flow chart illustrating an example method for configuring an analog-to-digital converter according to some aspects.

FIG. 16 is a flow chart illustrating an example wireless communication method 1600 according to some aspects of the disclosure. As described herein, some or all illustrated features may be omitted in a particular implementation within the scope of the present disclosure, and some illustrated features may not be required for implementation of all embodiments. In some examples, the method 1600 may be carried out by the BS 1500 illustrated in FIG. 15. In some examples, the method 1600 may be carried out by any suitable apparatus or means for carrying out the functions or algorithm described below.

At block 1602, a BS may determine a first number of bits for a user equipment to use for an analog-to-digital conversion of a transmission from the base station. For example, the ADC parameter selection circuitry 1542, shown and described above in connection with FIG. 15, may monitor one or more conditions (e.g., CRC pass estimates, interference, handover triggers, etc.) for the UE. The ADC parameter selection circuitry 1342 may then calculate, based on the monitored condition(s), the number of ADC bits to be used by the UE to receive a subsequent transmission by the gNB.

In some examples, determining the first number of bits may include estimating a quantity of bits needed for the user equipment to pass a cyclic redundancy check on the transmission. In some examples, determining the first number of bits may include estimating interference associated with the user equipment and selecting the first number of bits based on the interference.

At block 1604, the BS may transmit a first indication of the first number of bits to the user equipment. For example, the ADC parameter selection circuitry 1542 may generate a message that indicates the number of ADC bits the UE should use to receive an upcoming transmission by the gNB. The ADC parameter selection circuitry 1542 together with the communication and processing circuitry 1541 and the transceiver 1510, shown and described above in connection with FIG. 15, may then transmit the message on a designated channel (e.g., PDCCH or PDSCH) to the UE.

In some examples, transmitting the first indication may include transmitting the first indication via a radio resource control (RRC) message, a medium access control-control element (MAC-CE), or a downlink control information (DCI). In some examples, the first indication specifies at least one of an effective number of bits for the analog-to-digital conversion, an initial number of bits for the analog-to-digital conversion, a modulation and coding scheme, or a combination thereof.

At block 1606, the BS may transmit the transmission to the user equipment. For example, the communication and processing circuitry 1541 and the transceiver 1510, shown and described above in connection with FIG. 15, may encode data that has been scheduled for transmission to the UE and transmit the data on a designated channel (e.g., PDSCH) to the UE.

In some examples, the method may further include determining a plurality of quantization levels for the user equipment to use for the analog-to-digital conversion of the transmission. In some examples, the first indication specifies the plurality of quantization levels. In some examples, determining the plurality of quantization levels may include estimating the plurality of quantization levels based on at least one data block of the transmission. In some examples, determining the plurality of quantization levels may include estimating interference associated with the user equipment and selecting the plurality of quantization levels based on the interference.

In some examples, the method may further include determining distortion to add to the transmission based on the first number of bits. In some examples, the method may further include adding the distortion to the transmission.

In some examples, the method may further include receiving a second indication of a second number of bits selected by the user equipment for the analog-to-digital conversion of the transmission. In some examples, the second number of bits is different from the first number of bits. In some examples, the method may further include performing interference coordination for the user equipment based on the second number of bits.

In some examples, the method may further include estimating whether the user equipment will pass a cyclic redundancy check (CRC) on the transmission. In some examples, the estimating is based on the second number of bits. In some examples, the method may further include performing, based on the estimating whether the user equipment will pass the CRC on the transmission, at least one of link adaptation for the user equipment, interference management for the user equipment, a handoff for the user equipment, or a combination thereof. In some examples, the method may further include triggering the determining the first number of bits based on the estimating whether the user equipment will pass the CRC on the transmission.

In some examples, the method may further include performing a machine learning operation for adjusting at least one communication parameter for the user equipment. In some examples, the machine learning operation is based on the second number of bits.

In some examples, the method may further include selecting a tone reservation configuration for the user equipment based on the second number of bits. In some examples, the method may further include scheduling uplink resources for the user equipment based on the tone reservation configuration.

In some examples, the method may further include generating signal reconstruction information for the user equipment based on the second number of bits. In some examples, the method may further include transmitting the signal reconstruction information to the user equipment.

Aspect 1: A method for wireless communication at a user equipment, the method comprising: determining a first number of bits to use for an analog-to-digital conversion of a transmission from a base station; transmitting a first indication of the first number of bits to the base station; receiving the transmission from the base station; and performing the analog-to-digital conversion of the transmission.

Aspect 2: The method of aspect 1, wherein the first indication specifies an effective number of bits for the analog-to-digital conversion.

Aspect 3: The method of aspect 1 or 2, wherein determining the first number of bits comprises: measuring a reference signal received power (RSRP) or a signal-to-noise-plus interference ratio (SINR) of a signal received from the base station; and selecting the first number of bits based on the RSRP or the SINR.

Aspect 4: The method of any of aspects 1 through 3, wherein determining the first number of bits comprises: measuring interference at the user equipment; and selecting the first number of bits based on the interference.

Aspect 5: The method of any of aspects 1 through 4, wherein determining the first number of bits comprises: determining remaining battery power at the user equipment; and selecting the first number of bits based on the remaining battery power.

Aspect 6: The method of any of aspects 1 through 5, further comprising: determining a plurality of quantization levels for the analog-to-digital conversion of the transmission.

Aspect 7: The method of aspect 6, wherein the first indication specifies the plurality of quantization levels.

Aspect 8: The method of any of aspects 1 through 7, wherein transmitting the first indication comprises: transmitting the first indication via a channel state information (CSI) report message, a radio resource control (RRC) message, a medium access control-control element (MAC-CE), or an uplink control information (UCI).

Aspect 9: The method of any of aspects 1 through 8, further comprising: receiving a second indication from the base station; wherein the second indication specifies a second number of bits for the user equipment to use for the analog-to-digital conversion of the transmission; and wherein the second number of bits is different from the first number of bits.

Aspect 10: The method of aspect 9, wherein performing the analog-to-digital conversion of the transmission comprises: performing the analog-to-digital conversion of the transmission using the second number of bits.

Aspect 11: The method of any of aspects 1 through 10, further comprising: receiving a second indication from the base station; wherein the second indication specifies a plurality of quantization levels for the user equipment to use for the analog-to-digital conversion of the transmission.

Aspect 12: The method of aspect 11, wherein performing the analog-to-digital conversion of the transmission comprises: performing the analog-to-digital conversion of the transmission using the plurality of quantization levels.

Aspect 13: The method of any of aspects 1 through 12, further comprising: receiving a second indication of a modulation and coding scheme; and determining the first number of bits to use for the analog-to-digital conversion based on the second indication of the modulation and coding scheme.

Aspect 14: A user equipment (UE) comprising: a transceiver configured to communicate with a radio access network, a memory, and a processor communicatively coupled to the transceiver and the memory, wherein the processor and the memory are configured to perform any one of aspects 1 through 13.

Aspect 15: An apparatus configured for wireless communication comprising at least one means for performing any one of aspects 1 through 13.

Aspect 16: A non-transitory computer-readable medium storing computer-executable code, comprising code for causing an apparatus to perform any one of aspects 1 through 13.

Aspect 21: A method for wireless communication at a base station, the method comprising: determining a first number of bits for a user equipment to use for an analog-to-digital conversion of a transmission from the base station; transmitting a first indication of the first number of bits to the user equipment; and transmitting the transmission to the user equipment.

Aspect 22: The method of aspect 21, wherein the first indication specifies at least one of: an effective number of bits for the analog-to-digital conversion, an initial number of bits for the analog-to-digital conversion, a modulation and coding scheme, or a combination thereof.

Aspect 23: The method of aspect 21 or 22, wherein determining the first number of bits comprises: estimating a quantity of bits needed for the user equipment to pass a cyclic redundancy check on the transmission.

Aspect 24: The method of any of aspects 21 through 23, wherein determining the first number of bits comprises: estimating interference associated with the user equipment; and selecting the first number of bits based on the interference.

Aspect 25: The method of any of aspects 21 through 24, further comprising: determining a plurality of quantization levels for the user equipment to use for the analog-to-digital conversion of the transmission.

Aspect 26: The method of aspect 25, wherein the first indication specifies the plurality of quantization levels.

Aspect 27: The method of any of aspects 21 through 26, wherein determining the plurality of quantization levels comprises: estimating the plurality of quantization levels based on at least one data block of the transmission.

Aspect 28: The method of any of aspects 21 through 27, wherein determining the plurality of quantization levels comprises: estimating interference associated with the user equipment; and selecting the plurality of quantization levels based on the interference.

Aspect 29: The method of any of aspects 21 through 28, wherein transmitting the first indication comprises: transmitting the first indication via a radio resource control (RRC) message, a medium access control-control element (MAC-CE), or a downlink control information (DCI).

Aspect 30: The method of any of aspects 21 through 29, further comprising: determining distortion to add to the transmission based on the first number of bits; and adding the distortion to the transmission.

Aspect 31: The method of any of aspects 21 through 30, further comprising: receiving a second indication of a second number of bits selected by the user equipment for the analog-to-digital conversion of the transmission; wherein the second number of bits is different from the first number of bits.

Aspect 32: The method of aspect 31, further comprising: performing interference coordination for the user equipment based on the second number of bits.

Aspect 33: The method of aspect 31, further comprising: estimating whether the user equipment will pass a cyclic redundancy check (CRC) on the transmission; wherein the estimating is based on the second number of bits.

Aspect 34: The method of aspect 33, further comprising performing, based on the estimating whether the user equipment will pass the CRC on the transmission, at least one of: link adaptation for the user equipment, interference management for the user equipment, a handoff for the user equipment, or a combination thereof.

Aspect 35: The method of aspect 33, further comprising: triggering the determining the first number of bits based on the estimating whether the user equipment will pass the CRC on the transmission.

Aspect 36: The method of aspect 31, further comprising: performing a machine learning operation for adjusting at least one communication parameter for the user equipment; wherein the machine learning operation is based on the second number of bits.

Aspect 37: The method of aspect 31, further comprising: selecting a tone reservation configuration for the user equipment based on the second number of bits; and scheduling uplink resources for the user equipment based on the tone reservation configuration.

Aspect 38: The method of aspect 31, further comprising: generating signal reconstruction information for the user equipment based on the second number of bits; and transmitting the signal reconstruction information to the user equipment.

Aspect 39: A base station (BS) comprising: a transceiver, a memory, and a processor communicatively coupled to the transceiver and the memory, wherein the processor and the memory are configured to perform any one of aspects 21 through 38.

Aspect 40: An apparatus configured for wireless communication comprising at least one means for performing any one of aspects 21 through 38.

Aspect 41: A non-transitory computer-readable medium storing computer-executable code, comprising code for causing an apparatus to perform any one of aspects 21 through 38.

Several aspects of a wireless communication network have been presented with reference to an example implementation. As those skilled in the art will readily appreciate, various aspects described throughout this disclosure may be extended to other telecommunication systems, network architectures and communication standards.

By way of example, various aspects may be implemented within other systems defined by 3GPP, such as Long-Term Evolution (LTE), the Evolved Packet System (EPS), the Universal Mobile Telecommunication System (UMTS), and/or the Global System for Mobile (GSM). Various aspects may also be extended to systems defined by the 3rd Generation Partnership Project 2 (3GPP2), such as CDMA2000 and/or Evolution-Data Optimized (EV-DO). Other examples may be implemented within systems employing IEEE 802.11 (Wi-Fi), IEEE 802.16 (WiMAX), IEEE 802.20, Ultra-Wideband (UWB), Bluetooth, and/or other suitable systems. The actual telecommunication standard, network architecture, and/or communication standard employed will depend on the specific application and the overall design constraints imposed on the system.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure. As used herein, the term "determining" may encompass a wide variety of actions. For example, "determining" may include calculating, computing, processing, deriving, investigating, looking up (e.g., looking up in a table, a database or another data structure), ascertaining, resolving, selecting, choosing, establishing, receiving (e.g., receiving information), accessing (e.g., accessing data in a memory), and the like.

One or more of the components, steps, features and/or functions illustrated in FIGS. 1-16 may be rearranged and/or combined into a single component, step, feature or function or embodied in several components, steps, or functions. Additional elements, components, steps, and/or functions may also be added without departing from novel features disclosed herein. The apparatus, devices, and/or components illustrated in any of FIGS. 1-16 may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of example processes. Based upon design preferences, it is understood that the specific order or hierarchy of steps in the methods may be rearranged. The accompanying method claims present elements of the various steps in a sample order and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b, and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. A method for wireless communication at a user equipment, the method comprising:
    transmitting capability information to a base station, the capability information indicating that the user equipment supports reconfiguration of at least one analog-to-digital converter parameter;
    selecting at least one of: a first number of bits to use for an analog-to-digital conversion of a transmission from the base station;
    a first plurality of quantization levels for the analog-to-digital conversion of the transmission, or a combination thereof;
    transmitting a first indication of at least one of: the first number of bits, the first plurality of quantization levels, or a combination thereof to the base station;
    receiving the transmission from the base station; and
    performing the analog-to-digital conversion of the transmission.

2. The method of claim 1, wherein the first indication specifies an effective number of bits for the analog-to-digital conversion.

3. The method of claim 1, wherein the selecting the first number of bits comprises:
    measuring a reference signal received power (RSRP) or a signal-to-noise-plus interference ratio (SINR) of a signal received from the base station; and
    selecting the first number of bits based on the RSRP or the SINR.

4. The method of claim 1, wherein the selecting the first number of bits comprises:
    measuring interference at the user equipment; and
    selecting the first number of bits based on the interference.

5. The method of claim 1, wherein the selecting the first number of bits comprises:
    determining remaining battery power at the user equipment; and
    selecting the first number of bits based on the remaining battery power.

6. A user equipment, comprising:
    a transceiver;
    a memory; and
    one or more processors coupled to the transceiver and the memory, wherein the one or more processors is configured to:
        transmit capability information to a base station via the transceiver, the capability information indicating that the user equipment supports reconfiguration of at least one analog-to-digital converter parameter;

select at least one of: a first number of bits to use for an analog-to-digital conversion of a transmission from the base station;
a first plurality of quantization levels for the analog-to-digital conversion of the transmission, or a combination thereof;
transmit a first indication of the first number of bits, the first plurality of quantization levels, or a combination thereof to the base station via the transceiver;
receive the transmission from the base station via the transceiver; and
perform the analog-to-digital conversion of the transmission.

7. The user equipment of claim 6, wherein:
the one or more processors is further configured to receive a second indication from the base station;
the second indication specifies a second number of bits for the user equipment to use for the analog-to-digital conversion of the transmission; and
the second number of bits is different from the first number of bits.

8. The user equipment of claim 7, wherein the one or more processors is further configured to:
perform the analog-to-digital conversion of the transmission using the second number of bits.

9. The user equipment of claim 6, wherein:
the one or more processors is further configured to receive a second indication from the base station;
the second indication specifies a second plurality of quantization levels for the user equipment to use for the analog-to-digital conversion of the transmission; and
the one or more processors is further configured to perform the analog-to-digital conversion of the transmission using the second plurality of quantization levels.

10. The user equipment of claim 6, wherein the one or more processors is further configured to:
receive a second indication of a modulation and coding scheme; and
determine the first number of bits to use for the analog-to-digital conversion based on the second indication of the modulation and coding scheme.

11. A method for wireless communication at a base station, the method comprising:
receiving capability information from a user equipment, the capability information indicating that the user equipment supports reconfiguration of at least one analog-to-digital converter parameter;
selecting at least one of: a first number of bits for the user equipment to use for an analog-to-digital conversion of a transmission from the base station;
a plurality of quantization levels for the user equipment to use for the analog-to-digital conversion of the transmission, or a combination thereof;
transmitting a first indication of at least one of: the first number of bits, the plurality of quantization levels, or a combination thereof to the user equipment; and
transmitting the transmission to the user equipment.

12. The method of claim 11, wherein the first indication specifies at least one of: an effective number of bits for the analog-to-digital conversion, an initial number of bits for the analog-to-digital conversion, a modulation and coding scheme, or a combination thereof.

13. The method of claim 11, wherein the selecting the first number of bits comprises:

estimating a quantity of bits needed for the user equipment to pass a cyclic redundancy check on the transmission.

14. The method of claim 11, wherein the selecting the first number of bits further comprises:
estimating interference associated with the user equipment; and
selecting the first number of bits based on the interference.

15. The method of claim 11, wherein the first indication specifies specific quantization levels for the plurality of quantization levels.

16. The method of claim 11, wherein the selecting the plurality of quantization levels comprises:
estimating the plurality of quantization levels based on at least one data block of the transmission.

17. The method of claim 11, wherein the selecting the plurality of quantization levels comprises:
estimating interference associated with the user equipment; and
selecting the plurality of quantization levels based on the interference.

18. A base station, comprising:
a transceiver;
a memory; and
a processor communicatively coupled to the transceiver and the memory, wherein the one or more processors is configured to:
receive capability information from a user equipment via the transceiver, the capability information indicating that the user equipment supports reconfiguration of at least one analog-to-digital converter parameter;
select at least one of: a first number of bits for the user equipment to use for an analog-to-digital conversion of a transmission from the base station;
a plurality of quantization levels for the user equipment to use for the analog-to-digital conversion of the transmission, or a combination thereof;
transmit a first indication of at least one of: the first number of bits, the plurality of quantization levels, or a combination thereof to the user equipment via the transceiver; and
transmit the transmission to the user equipment via the transceiver.

19. The base station of claim 18, wherein the one or more processors is further configured to:
determine distortion to add to the transmission based on the first number of bits; and
add the distortion to the transmission.

20. The base station of claim 18, wherein:
the one or more processors is further configured to receive a second indication of a second number of bits selected by the user equipment for the analog-to-digital conversion of the transmission; and
the second number of bits is different from the first number of bits.

21. The base station of claim 20, wherein the one or more processors is further configured to:
perform interference coordination for the user equipment based on the second number of bits.

22. The base station of claim 20, wherein:
the one or more processors is further configured to estimate whether the user equipment will pass a cyclic redundancy check (CRC) on the transmission; and
the estimate whether the user equipment will pass the CRC on the transmission is based on the second number of bits.

23. The base station of claim 22, wherein the one or more processors is further configured to perform, based on the estimate whether the user equipment will pass the CRC on the transmission, at least one of: link adaptation for the user equipment, interference management for the user equipment, a handoff for the user equipment, or a combination thereof.

24. The base station of claim 22, wherein the one or more processors is further configured to:
trigger the selection of the first number of bits based on the estimate whether the user equipment will pass the CRC on the transmission.

25. The base station of claim 20, wherein:
the one or more processors is further configured to perform a machine learning operation for adjusting at least one communication parameter for the user equipment; and
the machine learning operation is based on the second number of bits.

26. The base station of claim 20, wherein the one or more processors is further configured to:
select a tone reservation configuration for the user equipment based on the second number of bits; and
schedule uplink resources for the user equipment based on the tone reservation configuration.

27. The base station of claim 20, wherein the one or more processors is further configured to:
generate signal reconstruction information for the user equipment based on the second number of bits; and
transmit the signal reconstruction information to the user equipment.

28. The method of claim 1, wherein the selecting the first plurality of quantization levels comprises:
measuring a reference signal received power (RSRP) or a signal-to-noise-plus interference ratio (SINR) of a signal received from the base station; and
selecting the first plurality of quantization levels based on the RSRP or the SINR.

29. The method of claim 1, wherein the selecting the first plurality of quantization levels comprises:
measuring interference at the user equipment; and
selecting the first plurality of quantization levels based on the interference.

30. The method of claim 1, wherein the selecting the first plurality of quantization levels comprises:
determining remaining battery power at the user equipment; and
selecting the first plurality of quantization levels based on the remaining battery power.

* * * * *